United States Patent
Machida et al.

(10) Patent No.: US 10,594,969 B2
(45) Date of Patent: *Mar. 17, 2020

(54) SOLID-STATE IMAGE SENSOR, IMAGING DEVICE, AND ELECTRONIC DEVICE

(71) Applicant: SONY CORPORATION, Tokyo (JP)

(72) Inventors: Takashi Machida, Tokyo (JP); Kazuyoshi Yamashita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/388,685

(22) Filed: Apr. 18, 2019

(65) Prior Publication Data

US 2019/0246055 A1   Aug. 8, 2019

Related U.S. Application Data

(63) Continuation of application No. 15/945,539, filed on Apr. 4, 2018, now Pat. No. 10,313,618, which is a
(Continued)

(30) Foreign Application Priority Data

Dec. 18, 2014   (JP) ................................. 2014-256046

(51) Int. Cl.
*H04N 5/374* (2011.01)
*H04N 5/232* (2006.01)
(Continued)

(52) U.S. Cl.
CPC ........... *H04N 5/374* (2013.01); *G01S 7/4863* (2013.01); *G01S 17/89* (2013.01); *G01S 17/936* (2013.01);
(Continued)

(58) Field of Classification Search
CPC ........ H04N 5/374; H04N 5/369; H04N 5/378; H04N 5/23212; H04N 5/355;
(Continued)

(56) References Cited

U.S. PATENT DOCUMENTS 9,986,186 B2 * 5/2018 Machida ................. H01L 27/14
10,313,618 B2 * 6/2019 Machida ................. H01L 27/14
(Continued)

FOREIGN PATENT DOCUMENTS

JP   2006-262358   9/2006
JP   2010-206095   9/2010
(Continued)

OTHER PUBLICATIONS

Official Action (no English translation available) for Japanese Patent Application No. 2016564790, dated Dec. 3, 2019, 7 pages.

*Primary Examiner* — Lin Ye
*Assistant Examiner* — John H Morehead, III
(74) *Attorney, Agent, or Firm* — Sheridan Ross P.C.

(57) ABSTRACT

The present technology relates to a solid-state image sensor, an imaging device, and an electronic device capable of switching FD conversion efficiency in all pixels of a solid-state image sensor. A photodiode performs photoelectric conversion on incident light. A floating diffusion (FD) stores charge obtained by the photodiode. FD2, which is a second FD to which the capacity of an additional capacitor MIM is added, adds the capacity to the FD. The additional capacitor MIM is constituted by a first electrode formed by a wiring layer and a second electrode formed by a metallic light blocking film provided on a surface of a substrate on which the photodiode is formed. Switching between the FD and FD+FD2 allows switching of the FD conversion efficiency. The present technology is applicable to a CMOS image sensor.

15 Claims, 16 Drawing Sheets

Related U.S. Application Data continuation of application No. 15/117,021, filed as application No. PCT/JP2015/084253 on Dec. 7, 2015, now Pat. No. 9,986,186.

(51) Int. Cl.

| | | |
|---|---|---|
| *H04N 5/355* | (2011.01) | |
| *H04N 5/369* | (2011.01) | |
| *H04N 5/378* | (2011.01) | |
| *H01L 27/14* | (2006.01) | |
| *H01L 27/146* | (2006.01) | |
| *G01S 17/93* | (2020.01) | |
| *G01S 7/4863* | (2020.01) | |
| *G01S 17/89* | (2020.01) | |
| *H01L 23/522* | (2006.01) | |

(52) U.S. Cl.
CPC .......... *H01L 23/5223* (2013.01); *H01L 27/14* (2013.01); *H01L 27/146* (2013.01); *H01L 27/14609* (2013.01); *H04N 5/23212* (2013.01); *H04N 5/355* (2013.01); *H04N 5/369* (2013.01); *H04N 5/378* (2013.01)

(58) Field of Classification Search
CPC ... H01L 23/5223; H01L 27/14; H01L 27/146; H01L 27/14609; G01S 17/936; G01S 7/4863; G01S 17/89
See application file for complete search history.

(56) References Cited

U.S. PATENT DOCUMENTS

| | | | | |
|---|---|---|---|---|
| 2002/0000508 A1* | 1/2002 | Muramatsu | ....... | H01L 27/14601 250/208.1 |
| 2006/0221667 A1* | 10/2006 | Ogura | ............... | H01L 27/14625 365/149 |
| 2006/0256221 A1* | 11/2006 | Mckee | .............. | H01L 27/14603 348/308 |
| 2007/0152291 A1* | 7/2007 | Lim | .................. | H01L 27/14603 257/461 |
| 2009/0201400 A1* | 8/2009 | Zhang | ............... | H01L 27/14609 348/296 |
| 2009/0295973 A1* | 12/2009 | Oshikubo | ............ | H04N 5/3559 348/311 |
| 2010/0238334 A1* | 9/2010 | Takahashi | ......... | H01L 27/14632 348/305 |
| 2012/0001289 A1* | 1/2012 | Ahn | .................. | H01L 27/14621 257/432 |
| 2012/0256077 A1 | 10/2012 | Yen et al. | | |
| 2012/0300102 A1* | 11/2012 | Tamura | ............. | H01L 27/14607 348/294 |
| 2013/0001403 A1* | 1/2013 | Yamakawa | ....... | H01L 27/14609 250/208.1 |
| 2013/0070131 A1* | 3/2013 | Ohkubo | ............ | H01L 27/14623 348/294 |
| 2014/0008520 A1* | 1/2014 | Raynor | ............ | H01L 27/14612 250/208.1 |
| 2014/0091378 A1* | 4/2014 | Hashimoto | ....... | H01L 27/14623 257/294 |
| 2014/0151531 A1* | 6/2014 | Yamashita | ....... | H01L 27/14607 250/208.1 |
| 2016/0126282 A1* | 5/2016 | Chen | ................. | H01L 27/14643 257/225 |

FOREIGN PATENT DOCUMENTS

| | | |
|---|---|---|
| JP | 2012-505422 | 3/2012 |
| JP | 2012-079861 | 4/2012 |
| JP | 2012-129798 | 7/2012 |
| JP | 2012-147169 | 8/2012 |
| JP | 2012-151774 | 8/2012 |
| JP | 2012-248681 | 12/2012 |
| JP | 2012-248682 | 12/2012 |
| JP | 2013-145779 | 7/2013 |
| JP | 2014-112580 | 6/2014 |
| WO | WO 2005/083790 | 9/2005 |

\* cited by examiner

SOLID-STATE IMAGE SENSOR, IMAGING DEVICE, AND ELECTRONIC DEVICE

CROSS REFERENCE TO RELATED APPLICATIONS

This application is a continuation of U.S. application Ser. No. 15/945,539, filed Apr. 4, 2018, which is a continuation of U.S. application Ser. No. 15/117,021, filed Aug. 5, 2016, now U.S. Pat. No. 9,986,186, which is a national stage application under 35 U.S.C. 371 and claims the benefit of PCT Application No. PCT/JP2015/084253 having an international filing date of Dec. 7, 2015, which designated the United States, which PCT application claimed the benefit of Japanese Patent Application No. 2014-256046 filed Dec. 18, 2014, the disclosures of which are incorporated herein by reference in their entirety.

TECHNICAL FIELD

The present technology relates to a solid-state image sensor, an imaging device, and an electronic device, and more particularly to a solid-state image sensor, an imaging device, and an electronic device capable of switching FD conversion efficiency in all pixels.

BACKGROUND ART

A solid-state image sensor (image sensor) having a feature of switching the conversion efficiency of floating diffusion (FD) provided in each pixel has been proposed (refer to Patent Document 1).

Since the FD conversion efficiency is define by a value proportional to an inverse of a parasitic capacitance of the FD, the switching of conversion efficiency is achieved by switching of the parasitic capacitance.

The technology according to Patent Document 1 is based on a typical Complementary Metal Oxide Semiconductor (CMOS) image sensor and provides a gate for switching between a first FD having a first capacity and a second FD having a second capacity larger than the first capacity. For making the conversion efficiency higher, the gate is turned off so that the parasitic capacitance to the first FD is minimized, whereas for making the conversion efficiency lower, the gate is turned on to connect the first FD and the second FD with each other so that the parasitic capacitance is maximized.

Furthermore, the technology of Patent Document 1 proposes combining (ZAF) pixels for imaging plane phase difference detection to switch the FD conversion efficiency.

In an image sensor having imaging plane phase difference detection, (ZAF) pixels for imaging plane phase difference detection for autofocus are embedded in a normal pixel array. A ZAF pixel is provided with a light blocking wiring layer for blocking part of incident light as compared to a normal pixel. The light blocking wiring layer has a larger area than other normal wirings owing to the property of blocking light.

In the technology of Patent Document 1, the ZAF light blocking wiring layer is used to form parasitic capacitance as the second capacity for switching the FD conversion efficiency, and switching of the conversion efficiency is achieve by switching the use of the parasitic capacitance.

CITATION LIST

Patent Document

Patent Document 1: Japanese Patent Application Laid-Open No. 2014-112580

SUMMARY OF THE INVENTION

Problems to be Solved by the Invention

For maximizing sensitivity in a normal pixel, optimization is performed by focusing a microlens provided on the pixel surface on the surface of a photodiode. In contrast, in a ZAF pixel, optimization is performed by focusing a microlens on the surface of the light blocking film owing to the phase difference detection characteristics.

Note that, since the light blocking wiring layer for ZAF is provided at a position away from the photodiode surface, the optimum curvature of the microlens is different in a normal pixel and a ZAF pixel. Thus, if it is attempted to optimize the microlenses in both pixels, microlenses having different curvatures need to be produced for different pixels, which increases the number of processes and results in high cost. If priority is given to the number of processes (priority is given to lower cost) and microlenses having the same curvature are used for all the pixels, at least either of the sensitivity characteristic of normal pixels and the phase difference detection characteristic of a ZAF pixel will be sacrificed.

Furthermore, since a light blocking wiring layer for ZAF is used to form the parasitic capacitance to be switched to, a capacity equivalent thereto cannot be formed in normal pixels that do not have light blocking wiring layers. Thus, the technology of Patent Document 1 can only be applied to ZAF pixels, which are only part of a solid-state image sensor, and cannot be applied to normal pixels.

The present technology is achieved in view of the aforementioned circumstances and, in particular, enables switching of FD conversion efficiency in all pixels.

Solutions to Problems

A solid-state image sensor according to one aspect of the present technology is a front-surface illuminated solid-state image sensor including: a photoelectric converter configured to perform photoelectric conversion of incident light; a charge-to-voltage converter configured to store charge obtained by the photoelectric conversion; a charge storage configured to add a capacity to the charge-to-voltage converter; and an additional capacitor configured to add a capacity to the charge storage, wherein the additional capacitor is constituted by a first electrode formed by a wiring layer in which wiring electrically connected to terminals of the voltage converter and the charge storage, and a second electrode formed by a metallic layer provided on a surface of a substrate on which the photoelectric converter is formed, the surface of the substrate being on a side closer to a light source of the light, the metallic layer being provided closer to the substrate than the wiring layer is and being opposed to the wiring layer.

The charge storage and the additional capacitor may be provided for each pixel having the photoelectric converter, and when charge is stored in the charge-to-voltage converter in a given pixel, the charge storage provided in the given pixel may add a charge capacity including an additional capacity stored by the additional capacitor to the charge-to-voltage converter.

A switching unit configured to switch to either of a state in which the charge-to-voltage converter and the charge storage are electrically connected with each other and a state in which the charge-to-voltage converter and the charge storage are electrically disconnected from each other may further be included.

The metallic layer may be a light blocking film made of metal.

The metallic layer may be a light blocking film made of tungsten.

The light blocking film may be formed for forming a pixel for imaging plane phase difference detection.

When a polysilicon layer is provided on the surface of the substrate on the side of the light source of the light, the light blocking film may be formed on the polysilicon on the substrate.

The light blocking film may be formed on a transfer gate constituted by the polysilicon layer provided on the surface of the substrate on the side of the light source of the light.

The light blocking film may shield any of an upper portion, a lower portion, a left portion and a right portion of the photoelectric converter.

The wiring layer may be closer to the second electrode than a wiring layer of typical wiring is.

The solid-state image sensor is of a global shutter type, the solid-state image sensor may further include a storage unit configured to store pixel signals of respective pixels required for the global shutter type, and the light blocking film may shield the storage unit.

The first electrode may be provided at a position opposed to the light blocking film on the storage unit.

An imaging device according to one aspect of the present technology is an imaging device including a front-surface illuminated solid-state image sensor, the imaging device including: a photoelectric converter configured to perform photoelectric conversion of incident light; a charge-to-voltage converter configured to store charge obtained by the photoelectric conversion; a charge storage configured to add a capacity to the charge-to-voltage converter; and an additional capacitor configured to add a capacity to the charge storage, wherein the additional capacitor is constituted by a first electrode formed by a wiring layer in which wiring electrically connected to terminals of the voltage converter and the charge storage, and a second electrode formed by a metallic layer provided on a surface of a substrate on which the photoelectric converter is formed, the surface of the substrate being on a side closer to a light source of the light, the metallic layer being provided closer to the substrate than the wiring layer is and being opposed to the wiring layer.

An electronic device according to one aspect of the present technology is an electronic device including a front-surface illuminated solid-state image sensor, the electronic device including: a photoelectric converter configured to perform photoelectric conversion of incident light; a charge-to-voltage converter configured to store charge obtained by the photoelectric conversion; a charge storage configured to add a capacity to the charge-to-voltage converter; and an additional capacitor configured to add a capacity to the charge storage, wherein the additional capacitor is constituted by a first electrode formed by a wiring layer in which wiring electrically connected to terminals of the voltage converter and the charge storage, and a second electrode formed by a metallic layer provided on a surface of a substrate on which the photoelectric converter is formed, the surface of the substrate being on a side closer to a light source of the light, the metallic layer being provided closer to the substrate than the wiring layer is and being opposed to the wiring layer.

In one aspect of the present technology, a front-surface illuminated solid-state image sensor is included, photoelectric conversion is performed on incident light by a photoelectric converter, charge obtained by the photoelectric conversion is stored by a charge-to-voltage converter, a capacity is added to the charge-to-voltage converter by a charge storage, a capacity is added to the charge storage by an additional capacitor, and the additional capacitor is formed by a first electrode formed by a wiring layer in which wiring electrically connected to terminals of the voltage converter and the charge storage is formed, and a second electrode formed by a metallic layer provided on a surface of a substrate on which the photoelectric converter is formed, the surface of the substrate being on a side closer to a light source of the light, the metallic layer being provided closer to the substrate than the wiring layer is and being opposed to the wiring layer.

Effects of the Invention

According to one aspect of the present technology, the FD conversion efficiency can be switched in all the pixels of a solid-state image sensor.

MODE FOR CARRYING OUT THE INVENTION

Embodiments to which the present technology is applied will be described below with reference to the drawings.

First Embodiment

<Example Configuration of Solid-State Image Sensor>

Figure 1:
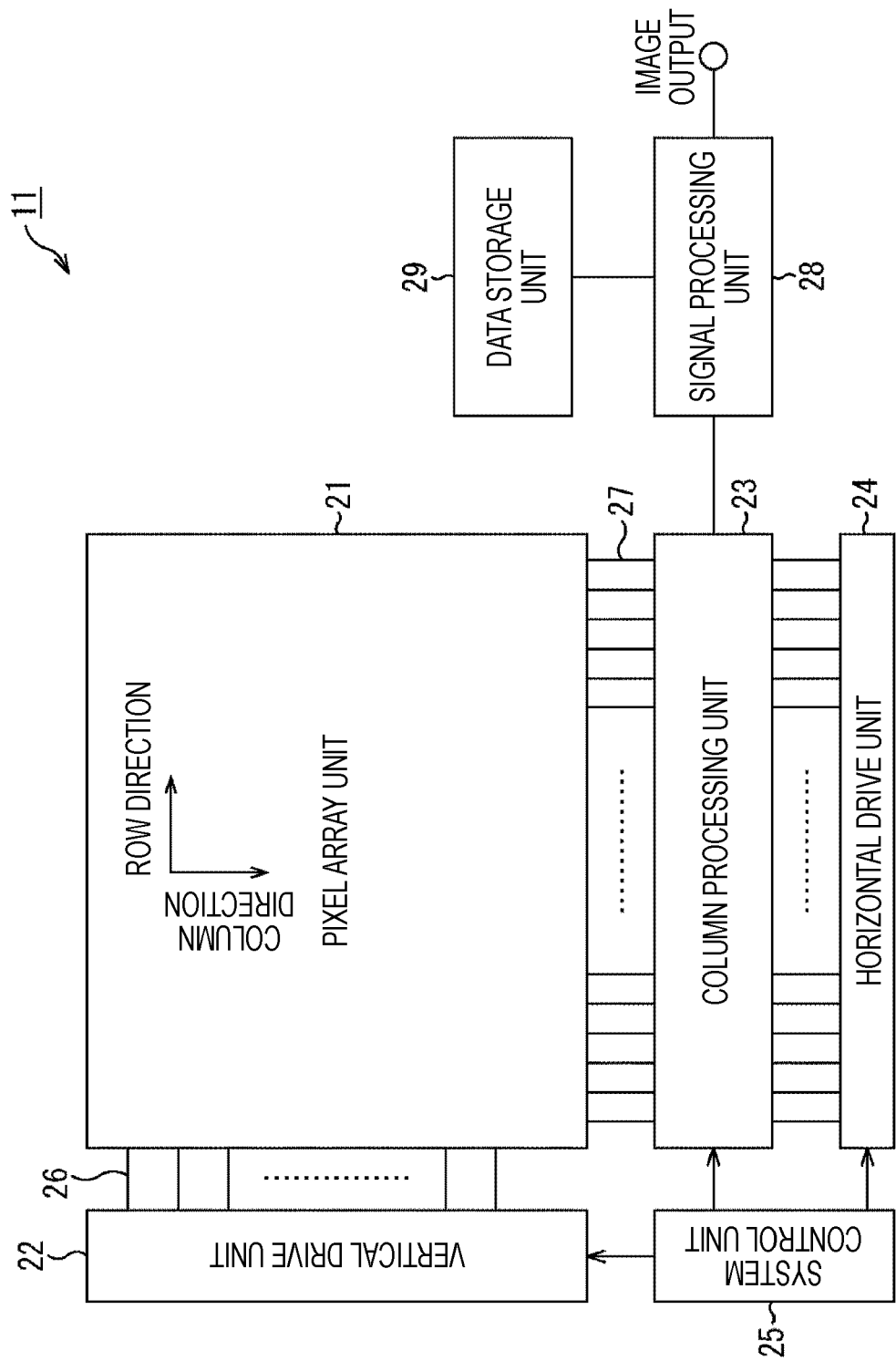
FIG. 1 is a diagram showing an example configuration of a solid-state image sensor.

First, an example configuration of a solid-state image sensor to which the present technology is applied will be described. FIG. 1 is a diagram showing an example configuration of a solid-state image sensor to which the present technology is applied according to an embodiment.

A solid-state image sensor 11 is a front-surface illuminated image sensor constituted by a Complementary Metal Oxide Semiconductor (CMOS) image sensor or the like, and is configured to take an image by receiving light from an object, performing photoelectric conversion thereon, and generating an image signal.

Note that a front-surface illuminated image sensor is an image sensor having a configuration in which a light receiving surface on which light from an object is incident, that is, microlenses (on-chip lenses) for focusing light and a wiring layer having wiring of transistors and the like for driving respective pixels are provided on photodiodes that receive light from an object.

The solid-state image sensor 11 includes a pixel array unit 21, a vertical drive unit 22, a column processing unit 23, a horizontal drive unit 24, a system control unit 25, pixel drive lines 26, vertical signal lines 27, a signal processing unit 28, and a data storage unit 29.

In the solid-state image sensor 11, the pixel array unit 21 is formed on a semiconductor substrate (chip), which is not shown, and the vertical drive unit 22 to the system control unit 25 are further integrated on the semiconductor substrate.

The pixel array unit 21 is constituted by pixels having photoelectric conversion elements for generating and storing an amount of charge corresponding to the amount of incident light from an object, where the pixels constituting the pixel array unit 21 are arranged two-dimensionally in the horizontal direction (row direction) and the vertical direction (column direction) in FIG. 1.

For example, in the pixel array unit 21, a pixel drive line 26 is wired along the row direction for each pixel row constituted by pixels arranged in the row direction, and a vertical signal line 27 is wired along the column direction for each pixel column constituted by pixels arranged in the column direction.

The vertical drive unit 22 includes a shift register, an address decoder, and the like, and is configured to supply signals or the like to the respective pixels via the pixel drive lines 26 to drive the pixels of the pixel array unit 21 all at the same time, in units of a row, or the like.

The column processing unit 23 reads signals from the pixels of each pixel column of the pixel array unit 21 via the vertical signal lines 27, and performs noise removal, correlated double sampling, Analog to Digital (A/D) conversion, and the like to generate a pixel signal.

The horizontal drive unit 24 includes a shift register, an address decoder, and the like, and is configured to sequentially select unit circuits, which are associated with the pixel columns, of the processing unit 23. As a result of this selective scanning of the horizontal drive unit 24, pixel signals subjected to signal processing for each unit circuit by the column processing unit 23 are sequentially output to the signal processing unit 28.

The system control unit 25 includes a timing generator for generating various timing signals, and is configured to perform drive control of the vertical drive unit 22, the column processing unit 23, and the horizontal drive unit 24 on the basis of the timing signals generated by the timing generator.

The signal processing unit 28 temporarily stores data into the data storage unit 29 where necessary, performs signal processing such as computation on pixel signals supplied from the column processing unit 23, and outputs an image signal constituted by the pixel signals.

<Pixel Circuit Configuration>

Figure 2:
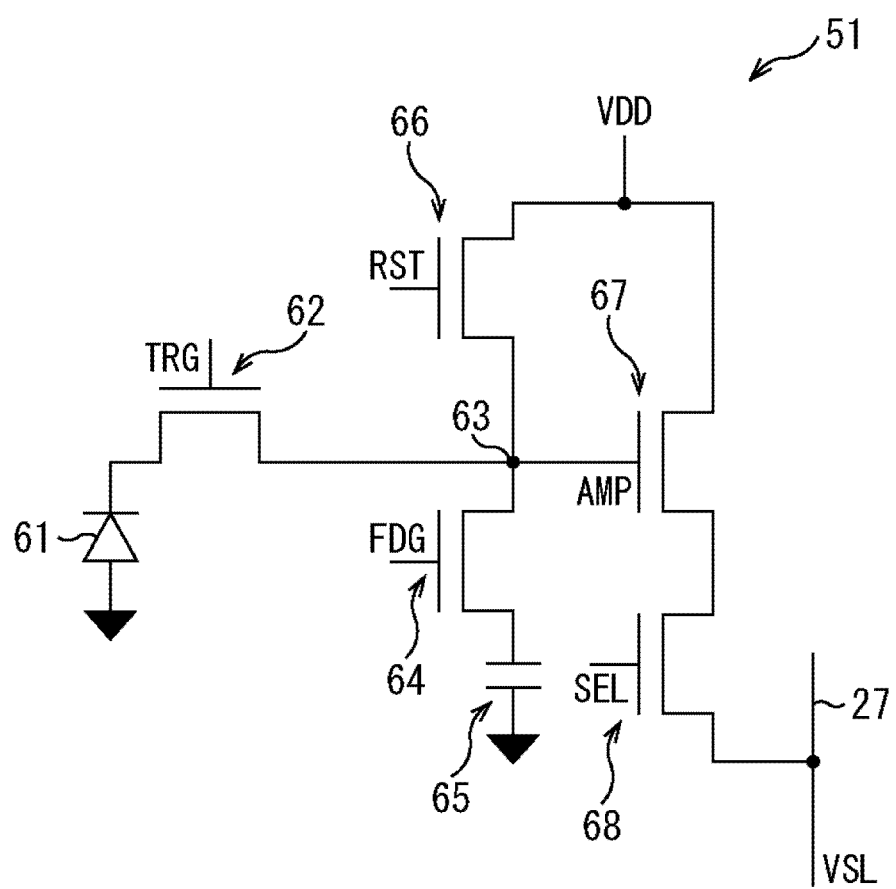
FIG. 2 is diagram for explaining an example configuration of each pixel on a substrate.

Next, a circuit configuration of each of the pixels of the pixel array unit 21 described above will be described. FIG. 2 is a circuit diagram showing an example circuit configuration of one of the pixels provided in the pixel array unit 21.

In FIG. 2, a pixel of the pixel array unit 21 includes a photodiode 61, a transfer gate 62, a charge-to-voltage converter 63, a capacity switch 64, a charge storage 65, a reset gate 66, an amplification transistor 67, and a selection transistor 68.

The photodiode 61 is a photoelectric conversion element constituted by a p-n junction photodiode, for example, and is configured to receive light from an object, generate an amount of charge corresponding to the amount of received light by photoelectric conversion, and store the generated charge.

The transfer gate 62 is provided between the photodiode 61 and the charge-to-voltage converter 63, and configured to transfer the charge stored in the photodiode 61 to the charge-to-voltage converter 63 according to a drive signal TRG applied to a gate electrode of the transfer gate 62.

In FIG. 2, for example, the transfer gate 62, the capacity switch 64, the reset gate 66, and the selection transistor 68 are constituted by n-channel MOS transistors.

Drive signals TRG, FDG, RST, and SEL are supplied to gate electrodes of the transfer gate 62 to the selection transistor 68, respectively. These drive signals are pulse signals that are in active states (ON states) at high level and in inactive states (OFF states) at low level.

Thus, at the transfer gate 62, for example, when the drive signal TRG supplied to the gate electrode of the transfer gate 62 is in the active state and the transfer gate 62 is thus turned on, the charge stored in the photodiode 61 is transferred to the charge-to-voltage converter 63.

The charge-to-voltage converter 63 is a floating diffusion region (FD) that converts the charge transferred from the photodiode 61 via the transfer gate 62 into an electrical signal such as a voltage signal, and outputs the resulting signal.

The charge-to-voltage converter 63 is connected with the reset gate 66, and also with a vertical signal line 27 via the amplification transistor 67 and the selection transistor 68. Furthermore, the charge-to-voltage converter 63 is also connected with the charge storage 65 via the capacity switch 64. The charge storage 65 is a floating diffusion region (FD) that converts charge into an electrical signal such as a voltage signal and further includes an additional capacitor MIM, which will be described below. Note that the charge storage 65 is a floating diffusion region (FD) but is represented by a circuit symbol of a capacitor because the charge storage 65 operates with the capacity including that of the additional capacitor MIM, which will be described below.

The capacity switch 64 is turned on or off according to the drive signal FDG, so as to switch the connection between the charge-to-voltage converter 63 and the charge storage 65 to either of an electrically connected state and an electrically disconnected state.

Specifically, the drive signal FDG is supplied to the gate electrode of the capacity switch 64, and when the drive signal FDG is turned on, the potential right beneath the capacity switch 64 becomes deeper and the charge-to-voltage converter 63 and the charge storage 65 are electrically connected with each other.

Conversely, when the drive signal FDG is turned off, the potential right beneath the capacity switch 64 becomes shallower and the charge-to-voltage converter 63 and the charge storage 65 are electrically disconnected from each other.

Thus, a capacity can be added to the charge-to-voltage converter 63 and the sensitivity of the pixel can be changed by turning the drive signal FDG on and off. Specifically, when the amount of change of the stored charge is represented by $\Delta Q$, and the amount of change of the voltage and the capacity when the charge change amount is $\Delta Q$ are represented by $\Delta V$ and C, respectively, the relation of $\Delta V=\Delta Q/C$ is satisfied.

With the capacity of the charge-to-voltage converter 63 being $C_{FD}$ and the capacity of the charge storage 65 being $C_{FD2}$, the capacity C in a region of a pixel from which a signal level is read is $C_{FD}+C_{FD2}$ while the drive signal FDG is in the ON state. In contrast, when the drive signal FDG is turned off, the capacity C changes to $C_{FD}$, and the voltage sensitivity with respect to the amount of charge change (the amount of voltage change: FD conversion efficiency) is thus increased.

As described above, in the solid-state image sensor 11, the sensitivity of a pixel is appropriately changed by turning the drive signal FDG on and off. For example, when the drive signal FDG is turned on, the charge storage 65 is electrically connected with the charge-to-voltage converter 63, and thus, part of the charge transferred from the photodiode 61 to the charge-to-voltage converter 63 is also stored in the charge storage 65 in addition to the charge-to-voltage converter 63.

The reset gate 66 is an element for initializing (resetting) regions from the charge-to-voltage converter 63 to the charge storage 65 as necessary, and has a drain connected to a power supply of a power supply voltage VDD and a source connected to the charge-to-voltage converter 63. The drive signal RST is applied as a reset signal to a gate electrode of the reset gate 66.

When the drive signal RST is brought into the active state, the reset gate 66 becomes a conductive state, and the potentials of the charge-to-voltage converter 63, etc. are reset to the power supply voltage VDD level. In other words, the charge-to-voltage converter 63, etc., are initialized.

The amplification transistor 67 has the gate electrode connected to the charge-to-voltage converter 63 and a drain connected to the power supply of the power supply voltage VDD, and functions as an input unit of a source follower circuit that reads charge obtained by photoelectric conversion at the photodiode 61. Specifically, the amplification transistor 67 has a source connected to the vertical signal line 27 via the selection transistor 68, and thus constitutes a constant current source and the source follower circuit, which are connected to one end of the vertical signal line 27.

The selection transistor 68 is connected between the source of the amplification transistor 67 and the vertical signal line 27, and the drive signal SEL is supplied as a selection signal to the gate electrode of the selection transistor 68. When the drive signal SEL is brought into the active state, the selection transistor 68 becomes a conductive state, and the pixel having the selection transistor 68 is brought into a selected state. When the pixel is brought into the selected state, a signal output from the amplification transistor 67 is read by the column processing unit 23 via the vertical signal line 27.

Furthermore, for the pixels, a plurality of drive lines are wired as the pixel drive lines 26 in FIG. 1 for each pixel row, for example. The drive signals TRG, FDG, RST, and SEL are thus supplied from the vertical drive unit 22 into the pixels via the drive lines that are the pixel drive lines 26.

<Pixel Physical Structure>

Next, a physical structure of the above-described pixel will be described with reference to FIGS. 3 to 6. Note that the components described with reference to FIG. 2 and components corresponding thereto will be designated by the same names and reference numerals, and the description thereof will not be repeated as appropriate.

Figure 3:
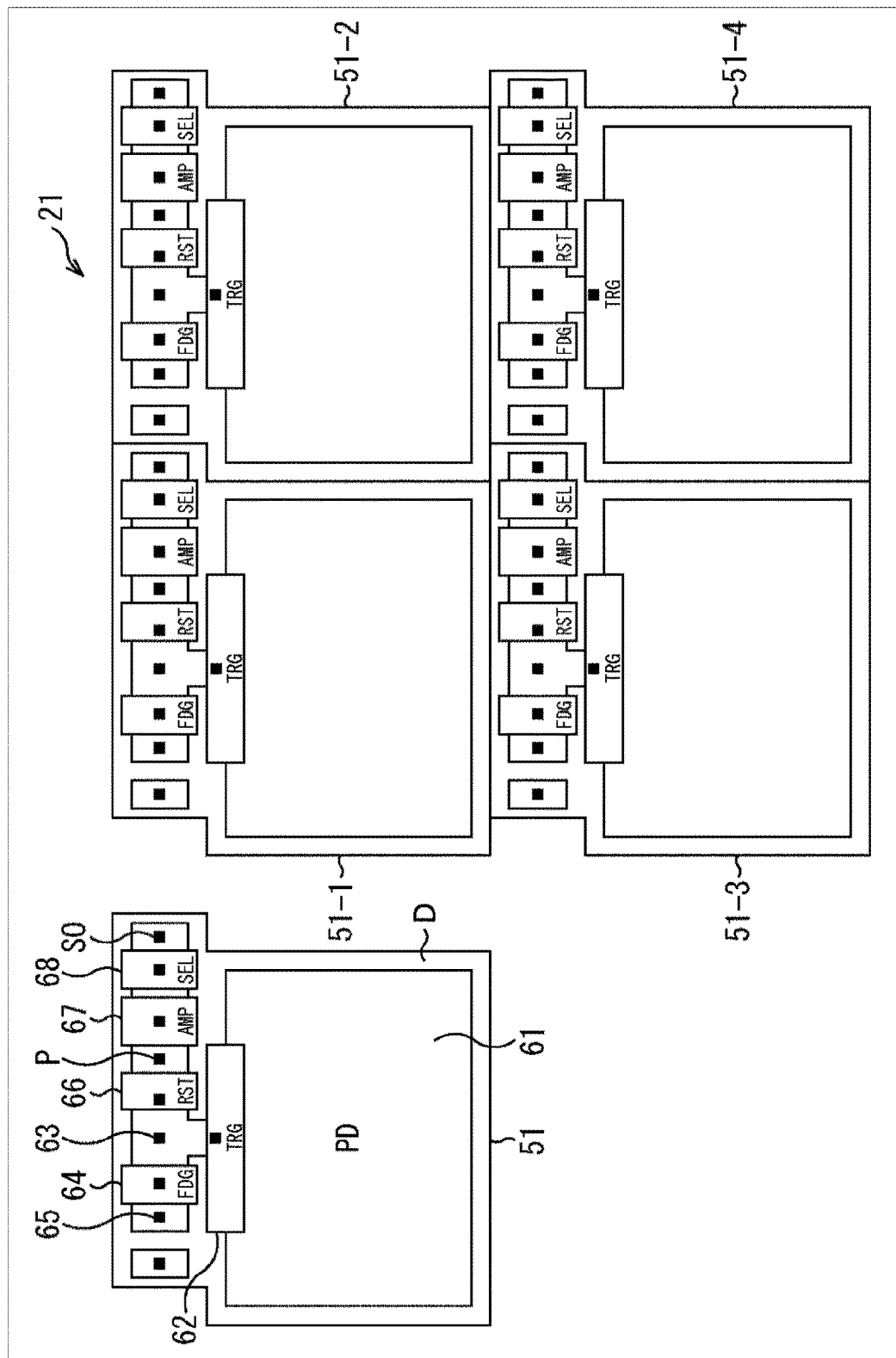
FIG. 3 is a diagram for explaining an example configuration of each pixel on a pixel array in FIG. 1.

FIG. 3 is a top view of a first layer of a pixel, in which an element isolation layer, polysilicon, and contacts on the substrate are formed. Note that in FIGS. 3 to 5, the direction toward the drawing sheet surface is the incident direction of the incident light, and that the photodiode (PD) 61 in FIG. 3 is the light receiving surface.

Figure 4:
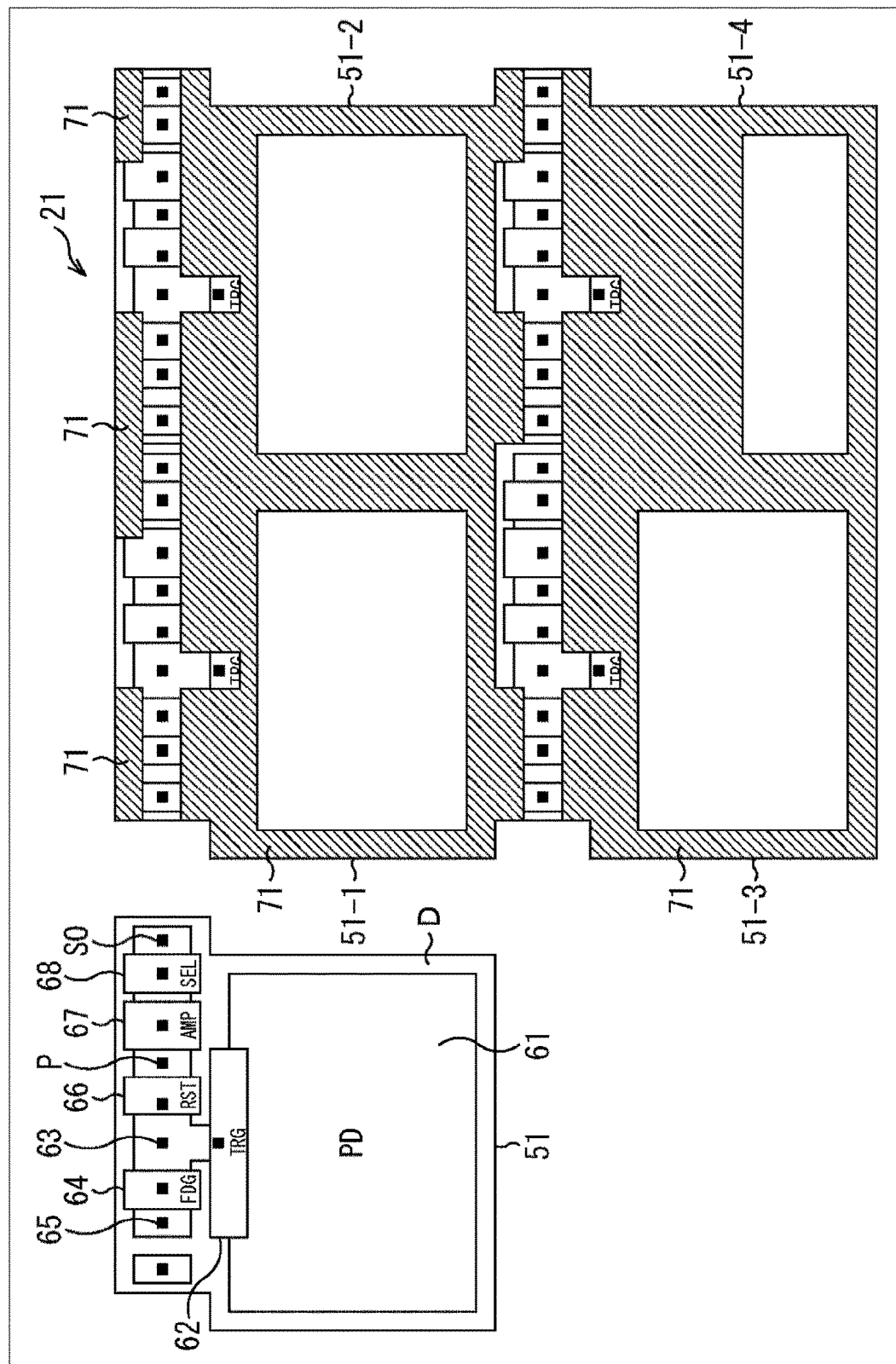
FIG. 4 is a diagram for explaining an example configuration of a metallic light blocking film formed on a substrate in FIG. 3.

In addition, FIG. 4 is a top view of a second layer, which is a layer on the first layer (the second layer being a layer on the side of a light source with respect to the incident direction of the incident light) and where a light blocking film is formed. Hereinafter, the second layer will also be referred to as a light blocking film layer.

Figure 5:
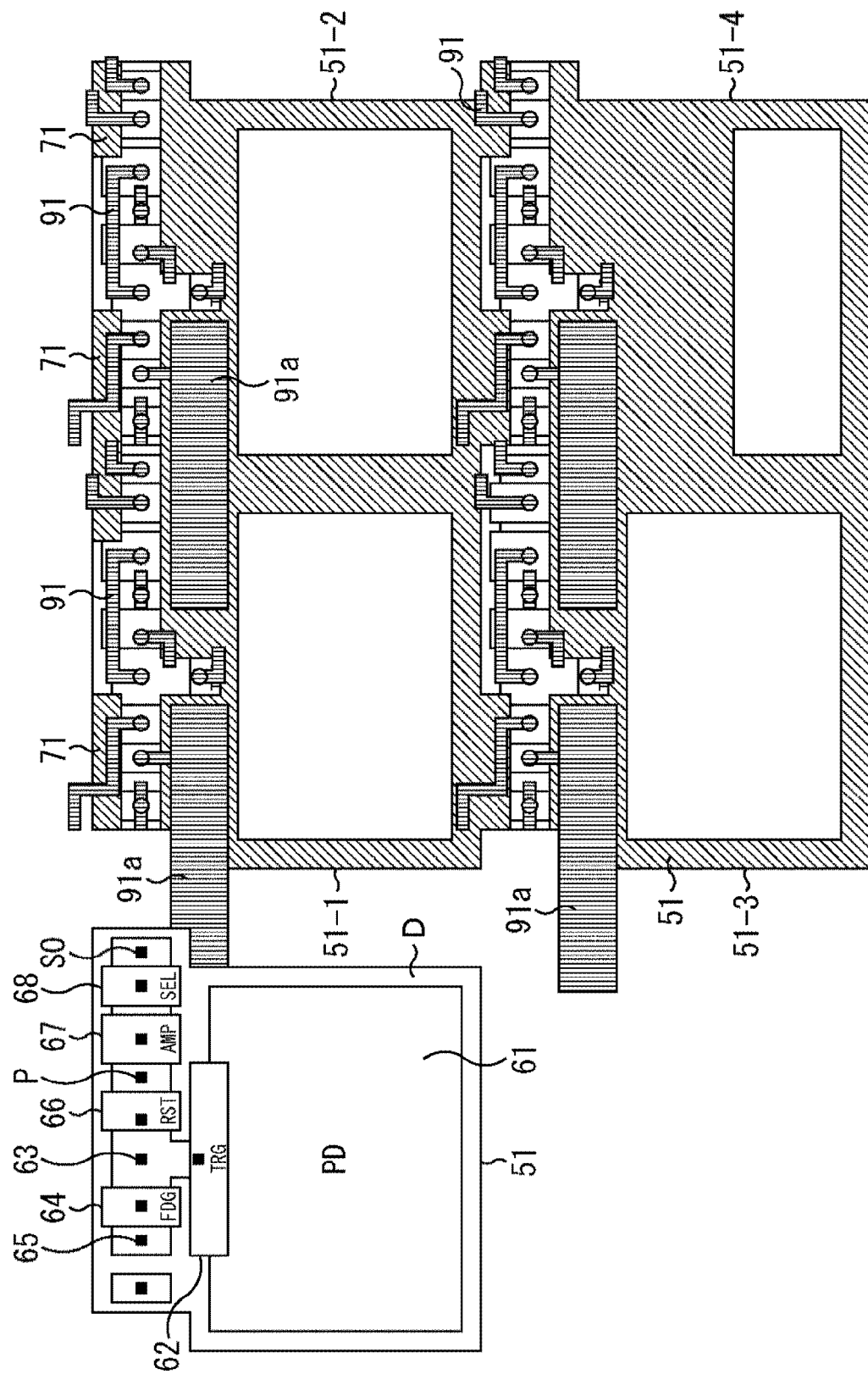
FIG. 5 is a diagram for explaining a configuration of a FD wiring layer formed on a layer constituted by the light blocking film in FIG. 4.

Furthermore, FIG. 5 is a top view of a third layer, which is a layer on the second layer and where wiring for connecting contacts is formed. Hereinafter, the third layer will also be referred to as a wiring layer.

Figure 6:
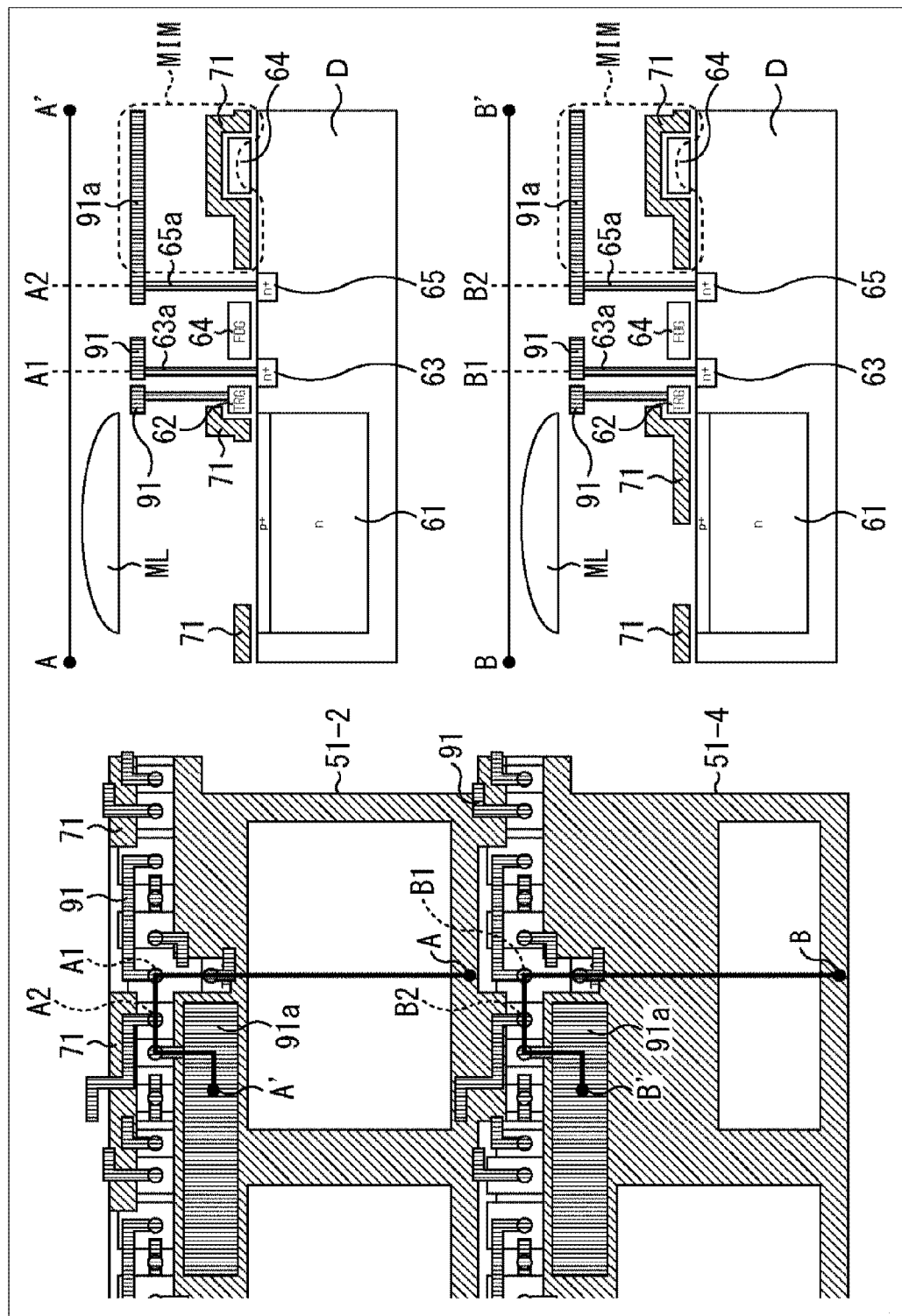
FIG. 6 is a diagram for explaining cross sections of a laminate of the layers of FIGS. 3 to 5.

Furthermore, FIG. 6 shows an A-A' cross section a B-B' cross section of a pixel in a state where the first to third layers are laminated, in which the upper right part of FIG. 6 shows the A-A' cross section of the upper left part of FIG. 6 in a case of a normal pixel.

Furthermore, the lower right part of FIG. 6 shows a side cross section of a pixel (ZAF pixel) for imaging plane phase difference detection, which is the B-B' cross section of the lower left part of FIG. 6. The side cross section in FIG. 6 is shown as a laminate of the first layer shown in FIG. 3, which is the lowermost layer, the second layer shown in FIG. 4, and the third layer shown in FIG. 5 in this order upward in the drawing.

Furthermore, in the cross sections of the upper right part and the lower right part of FIG. 6, the direction from up to down in the drawing is the incident direction of incident light. Black squares in FIGS. 3 to 5 represent the positions of (well) contacts (electrodes), and circles with vertical stripes in FIG. 6 represent points corresponding to contacts where wires are connected.

Furthermore, the upper left part in each of FIGS. 3 to 6 shows a top view of the first layer of one pixel, and the right part of each of FIGS. 3 to 6 shows a top view of four pixels of 2×2 pixels in the horizontal direction and in the vertical direction. Furthermore, out of the four pixels 51-1 to 51-4 in the right part of each of FIGS. 3 to 6, the lower right pixel 51-4 is a ZAF pixel while the other pixels 51-1 to 51-3 are normal pixels.

First, a physical configuration of the first layer of one pixel will be explained with reference to the upper left part of FIG. 3. A pixel 51 in FIG. 3 is surrounded by an element isolation layer D, and provided with the photodiode 61 in a substantially lower half area thereof.

The transfer gate (TRG) 62 is provided at an upper part of the photodiode 61 in FIG. 3, and the transfer gate 62 is opened and closed for transferring charge stored in the photodiode 61 to the charge-to-voltage converter 63 constituted by the floating diffusion region (floating diffusion (FD)).

The capacity switch 64 for controlling electrical connection between the charge storage 65, which constitutes a second floating diffusion region (FD), and the charge-to-voltage converter 63 is provided on the left of the charge-to-voltage converter 63 in FIG. 3. Thus, the capacity switch 64 is switched between on and off so that the charge storage 65 and the charge-to-voltage converter 63 are electrically connected with and disconnected from each other.

The reset gate 66 for discharging charge stored in the charge storage 65 and the charge-to-voltage converter 63 is provided on the right of the charge-to-voltage converter 63 in FIG. 3. Thus, the capacity switch 64 is switched between on and off so that the charge storage 65 and the charge-to-voltage converter 63 are electrically connected with and disconnected from each other.

The amplification transistor 67 is provided on the right of the reset gate 66 in FIG. 3. As also shown in FIGS. 5 and 6, the amplification transistor 67 is electrically connected by wiring 91 represented by vertical stripes, amplifies an electrical signal supplied from the charge-to-voltage converter 63 and outputs the amplified signal to the selection transistor 66.

The selection transistor 68 is provided on the right of the amplification transistor 67 in FIG. 3. When the drive signal SEL is brought into the active state, the selection transistor 68 becomes the conductive state, and a signal output from the amplification transistor 67 is output via a contact SO connected to the vertical signal line 27.

The right part of FIG. 3 shows four pixels, which are the pixels 51-1 to 51-4, of 2×2 pixels (horizontal direction× vertical direction), each of which being the pixel 51 shown in the left part of FIG. 3. The pixels 51 are arranged in the horizontal direction and the vertical direction in this manner to form the pixel array unit 21.

Next, with reference to FIG. 4, the second layer, which functions as the light blocking film layer formed by being stacked on the first layer on the side of the light source of incident light with respect to the light receiving surface, will be explained.

A range represented by hatching in the right part of FIG. 4 is the light blocking film 71. The light blocking film 71 is made of tungsten, for example. The light blocking film made of tungsten is a typical structure that is used for reducing light incidence (smear) on a vertical transfer path in a Charge Coupled Device (CCD) image sensor. However, while the light blocking film is used for smear reduction in CCDs, the light blocking film 71 is used for achieving a pixel for imaging plane phase difference detection.

Specifically, the lower right pixel 51-4 of the two vertical pixels×two horizontal pixels in the right part of FIG. 4 is a pixel (ZAF pixel) for imaging plane phase difference detection. The other pixels 51-1 to 51-3 are normal pixels having a layout in which the light blocking films 71 are open above the photodiodes 61. In contrast, the pixel (ZAF pixel) for imaging plane phase difference detection has a layout in which part of the photodiode 61 is shielded by the light blocking film 71. In FIG. 4, an example configuration in which the tops of the photodiodes 61 are shielded by the light blocking films 71 is shown.

In addition, since the light blocking film 71 forms the second layer made of a metallic layer formed between the first layer and the third layer, the light blocking film 71 is not provided at points where contacts are formed, so as to prevent occurrence of electrical short circuits.

Next, a configuration of the third layer will be explained with reference to FIG. 5.

The third layer is a FD wiring layer in which FD wiring 91 represented by vertical stripes in FIG. 5 and electrodes 91a for forming the additional capacitors MIM for giving additional capacities to the charge storages 65, which are the second FDs, are formed. The circles in the vertical stripes in FIG. 5, which are at positions corresponding to the contacts represented by the black squares in FIGS. 3 and 4, represent points where contacts are electrically connected. Furthermore, in the third layer shown by vertical stripes, the electrodes 91a having a rectangular shape are paired with the light blocking films 71 at positions, facing the electrodes 91a, in the second layer provided under the third layer, and form the additional capacitors MIM together. The capacities of the additional capacitors MIM are added to the capacities of the charge storages 65, and the FD conversion efficiency is thus lowered as described above.

Specifically, within ranges of A2-A' and B2-B' surrounded by dotted lines in the upper right part and the lower right part, respectively, of FIG. 6, the electrode 91a and the light blocking film 71 are opposed to each other in the vertical direction in FIG. 6, and such a configuration forms the additional capacitor MIM. In addition, the electrode 91a is connected via a contact 65a, which adds to the capacity of the charge storage 65 of a floating diffusion layer (n+) in the first layer, and the capacity switch 64 is turned on, which electrically connects with the charge-to-voltage converter 63 that is a floating diffusion region. This allows the FD conversion efficiency to be lowered.

In contrast, within ranges A1-A2 and B1-B2 in the upper right part and the lower right part, respectively, in FIG. 6, since the light blocking film 71 is not present and the additional capacitor MIM is not formed, the FD wiring 91 is connected with the charge-to-voltage converter 63, which is formed as the floating diffusion region (n+) in the first layer, via a contact 63a. In this case, unless the capacity switch 64 is turned on, the charge-to-voltage converter 63 has its own capacity only, and thus the FD conversion efficiency will not be lowered.

Consequently, the charge-to-voltage converter 63 and the charge storage 65 formed as described above are electrically connected with and disconnected from each other by the capacity switch 64, and this enables switching of the FD conversion efficiency (sensitivity) of pixel signals. Furthermore, with this configuration, since the FD conversion efficiency is switched according to whether or not the sum of the capacities of the charge storage 65 and the additional capacitor MIM is added to the capacity charge-to-voltage converter 63, this allows the FD conversion efficiency to be switched uniformly at all the pixels without distinction between normal pixels and pixels for imaging plane phase difference detection.

Furthermore, in a normal pixel, in order to maximize the sensitivity, the curvature of the microlens ML as shown in the upper right part and the lower right part of FIG. 6, for example, is adjusted so as to focus on the surface of the photodiode 61 (Si surface). In the case of a pixel (ZAF pixel) for imaging plane phase difference detection, focusing on the position (height) of the light blocking film 71 maximizes the characteristic of the pixel for imaging plane phase difference detection. Thus, if the light blocking film 71 and the surface (Si surface) of the photodiode 61 differ greatly in height, microlenses ML with different curvatures need to be used for normal pixels and for pixels for imaging plane phase difference detection so that the curvatures so that the normal pixels and the pixels for imaging plane phase difference detection respectively meet the above characteristics. It is therefore necessary to either increase the number of processes for processing or sacrifice any of the characteristics so as not to increase the number of processes.

However, as shown in the upper right part and the lower right part of FIG. 6, as a result of the light blocking film 71 being formed close to the photodiode 61 (as a result of formation of the pixel for imaging plane phase difference detection using the light blocking film 71), the characteristics can be maximized with microlenses ML all having the same curvature, which suppresses an increase in cost due to an increase in the number of processes that would occur for processing of microlenses of different curvatures.

In addition, in view of light incident obliquely, it is advantageous to form the light blocking film 71 immediately on the photodiode 61 so as to form a pixel (ZAF pixel) for imaging plane phase difference detection. Specifically, if the light blocking film 71 made of metal is formed in an upper layer at a height different from that of the photodiode 61, light incident obliquely may not be blocked by the light blocking film 71 but may pass through a gap between the light blocking film 71 and the Si surface and enter the photodiode 61. In contrast, as shown in the upper right part and the lower right part of FIG. 6, since the light blocking film 71 is formed immediately on the photodiode 61, oblique light will not enter the photodiode 61.

As described above, a metallic layer constituted by the light blocking film 71 is not provided in a layer immediately under the FD wiring 91, but the electrode 91a is provided only above the light blocking film 71 that forms the additional capacitor MIM for adding an additional capacity to the charge storage 65.

With this configuration, the capacity of the additional capacitor MIM is added to the charge capacity of the charge-to-voltage converter 63, which allows the capacity of the charge storage 65 to be set to a large value, and the charge-to-voltage converter 63 and the charge storage 65 are electrically connected with and disconnected from each other by the capacity switch 64, which practically allows switching between floating diffusion regions having different diffusion capacitances.

Consequently, the capacity is increased and the FD conversion efficiency is lowered by electrically connecting the charge-to-voltage converter 63 and the charge storage 65 with each other by the capacity switch 64. Conversely, the capacity is decreased and the conversion efficiency is increased by electrically disconnecting the charge-to-voltage converter 63 and the charge storage 65 from each other by the capacity switch 64. As a result of switching the FD conversion efficiency in this manner, the sensitivity can be switched.

In a case of a configuration in which the light blocking film 71 under the electrode 91a in the third layer covers a polysilicon gate, the capacity of the additional capacitor MIM can further be increased. Specifically, since the light blocking film 71 is formed in a shape following the pattern of the underlying shape, the distance between the light blocking film 71 and the electrode 91a at a portion where the polysilicon gate is present becomes smaller. As a result, as shown in the upper right part and the lower right part of FIG. 6, for example, in a case where a gate electrode of the transfer gate 64 is provided, the smaller distance between the light blocking film 71 and the electrode 91a increases the capacity of the additional capacitor MIM. Although the polysilicon gate is given herein as an example, any structure rising toward the upper layer from the surface of the substrate (Si) can produce similar effects. For example, element isolation with oxide films such as Locos may be used.

Furthermore, since the light blocking films 71 are not only placed in normal pixels but also in pixels (ZAF pixels) for imaging plane phase difference detection, the structures around the charge-to-voltage converters 63 are common in normal pixels and pixels for imaging plane phase difference detection, which makes the FD conversion efficiencies of the normal pixels and the pixels for imaging plane phase difference detection basically the same as each other.

Thus, normal pixels and pixels (ZAF pixels) for imaging plane phase difference detection have a common layout except for the portions shielding the photodiodes 61 of the pixels (ZAF pixels) for imaging plane phase difference detection, which allows the conversion efficiency to be the same in all the pixels. Consequently, such disadvantages that may be caused in subsequent processes due to the difference in the FD conversion efficiency between pixels are prevented.

Furthermore, if the light blocking films 71 are provided only in pixels for imaging plane phase difference detection, the light blocking film 71 would be provided in small sizes because the number of is smaller than the number of normal pixels and the pixels for imaging plane phase difference detection would thus be dotted in the pixel array unit 21. Since the light blocking films 71 would be electrically floating when provided in small sizes, the effect of generating the capacity for forming the charge storage 65 could not be produced. In order to prevent the light blocking films 71 from becoming electrically floating, the light blocking films 71 need to be fixed to a power supply, GND, or the like. If the wiring layout is changed therefor only in the pixels for imaging plane phase difference detection, there is a concern that the capacities (conversion efficiencies) generated by the charge-to-voltage converter 63 and the charge storage 65 are different from those of normal pixels, which is not preferable. For preventing the above, the light blocking films 71 are also provided in normal pixels, so that extraction to outside of the pixel array is possible only with the light blocking films 71, and a certain potential is applied thereto at outside of the pixel array 21 so that the light blocking films 71 will not become electrically floating.

First Modified Example

Figure 7:
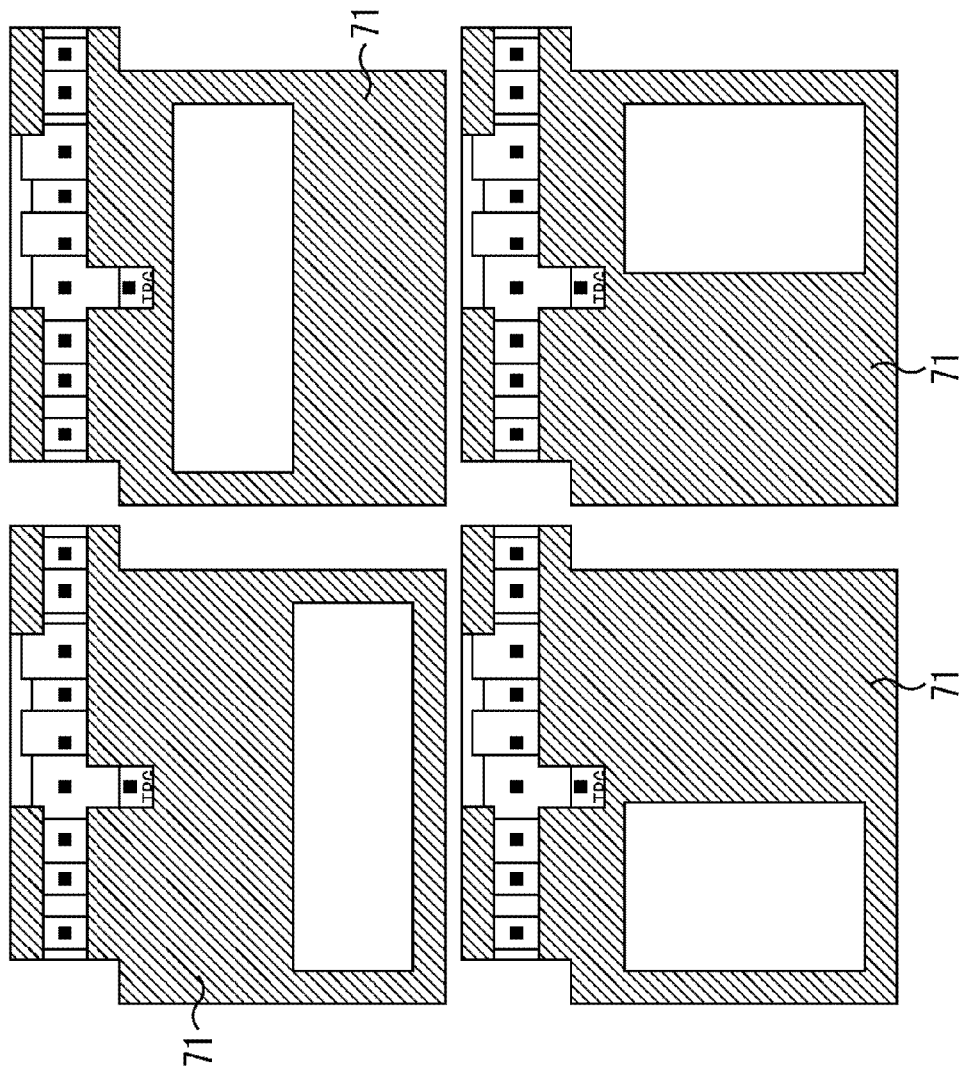
FIG. 7 is a diagram for explaining a first modified example, which is another example configuration of a metallic light blocking film formed on the substrate in FIG. 3.

An example has been explained above in which the light blocking films 71 are provided so as to shield the upper portions of the photodiodes 61 as shown in the upper left part of FIG. 7 in the formation of pixels for imaging plane phase difference detection. However, the light blocking films 71 may be provided in such a manner as to shield other portions of the photodiodes 61 as long as pixels for imaging plane phase difference detection can be formed. Specifically, as shown in the upper right part of FIG. 7, the light blocking parts 71 may be provided so that lower portions of the photodiodes 61 are shielded. Alternatively, as shown in the lower left part and the lower right part of FIG. 7, the light blocking parts 71 may be provided so that right portions and left portions of the respective photodiodes 61 are shielded.

Second Modified Example

Figure 8:
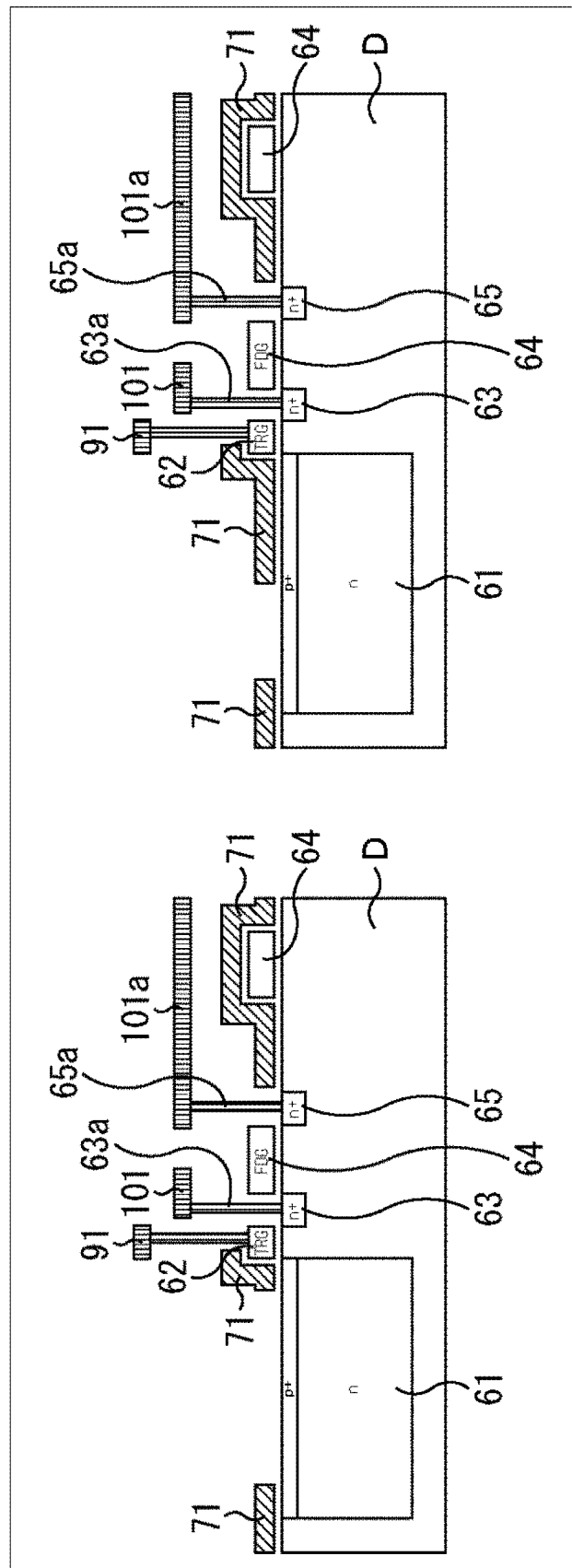
FIG. 8 is a diagram for explaining a second modified example, which is an example configuration in which a FD wiring layer is formed in a layer closer to the substrate than the aforementioned FD wiring layer is.
Figure 9:
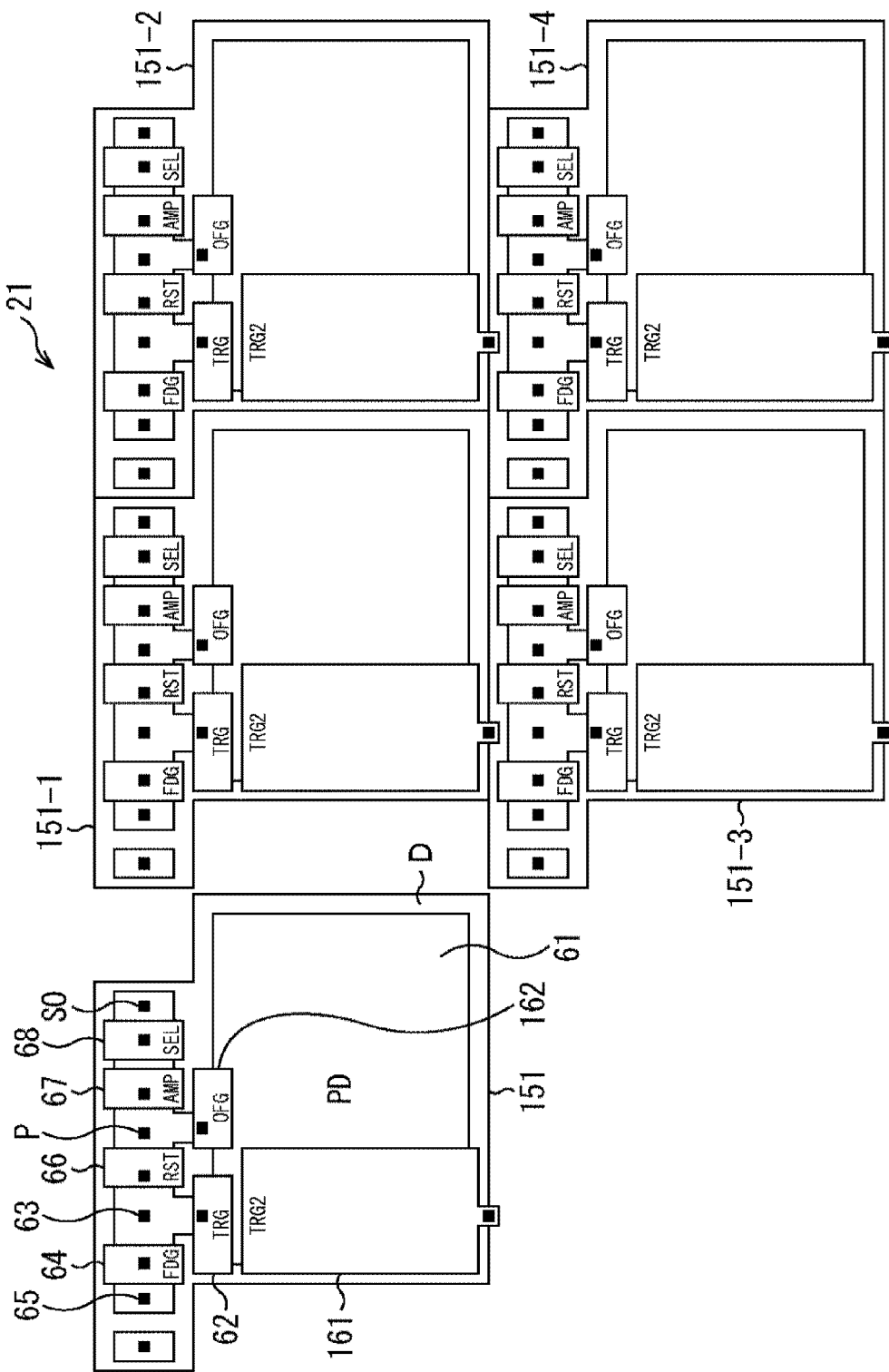
FIG. 9 is a diagram for explaining an example configuration of each pixel when the pixel array of FIG. 1 is of a global shutter type.

While an example in which the gate electrode of the transfer gate 62 is provided in the same metallic wiring layer as the FD wiring 91 has been described above, a FD wiring layer 101 may be used as the wiring layer at the charge-to-voltage converter 63 and the charge storage 65 and common wiring 91 may be used instead of the FD wiring 91 described above for the gate electrode of the transfer gate 62, so that an electrode 101a forming an additional capacitor MIM is formed in a layer closer to the light blocking film 71 as shown in FIG. 8, for example.

In FIG. 8, the left part shows a side cross section of a normal pixel corresponding to the upper right part of FIG. 6, and the right part shows a side cross section of a pixel for imaging plane phase difference detection corresponding to the lower right part of FIG. 6, each of which showing an example in which common wiring 91 is used instead of the FD wiring 91 described above and the FD wiring 101 is formed at a position closer to the light blocking film 71 than that of the above-described FD wiring 91.

With this configuration, since the electrode 101a forming the additional capacitor MIM is disposed at a position closer to the light blocking film 71, the capacity of the additional capacitor MIM is increased, which achieves a larger capacity together with the capacity of the charge storage 65 functioning as the second floating diffusion region, which allows the FD conversion efficiency to be further lowered, and which allows switching between two FD conversion efficiencies with a larger difference therebetween.

Furthermore, like the FD wiring 101, only the FD wiring 101 may be made to be wiring at a position close to the light blocking film 71, without changing the distances between the other common wiring 91 and the light blocking film 71. This allows the capacity between the common wiring 91 other than the FD wiring 101 and the light blocking film 71 not to be changed. As a result, it is possible to increase only the capacity of the additional capacitor MIM while preventing occurrence of failure such as an operating delay of transistors caused by an increase in the capacity between the common wiring 91 and the light blocking film 71.

Second Embodiment

While an example of a typical front-surface illuminated CMOS image sensor has been described above, the image sensor may be a so-called global shutter front-surface illuminated CMOS image sensor provided with a memory for each pixel and configured to simultaneously read pixel signals in all the pixels.

FIGS. 9 to 12 are diagrams showing a first layer to a third layer of a global shutter front-surface illuminated CMOS image sensor and side cross sections thereof corresponding to those of FIGS. 3 to 6, respectively. Note that, in FIGS. 9 to 12, the components having the same functions as those in FIGS. 3 to 6 will be designated by the same names and reference numerals, and the description thereof will not be repeated as appropriate.

Thus, FIGS. 9 to 12 differ from FIGS. 3 to 6 in that the pixels are shown as pixels 151 in FIGS. 9 to 12 while the pixels 51 are shown in units of a pixel in FIGS. 3 to 6.

Furthermore, each pixel 151 is provided with a transfer gate (TRG2) 151 for opening and closing a gate to a memory 171 (FIG. 12) that simultaneously stores a signal of charge accumulated by the photodiode (PD)61 in units of a pixel, and an overflow gate (OFG) 162 for resetting the photodiode 61.

The transfer gate 161 is disposed to cover the memory 171. The transfer gate 161 and the overflow gate 162 are driven by not-shown drive signals TRG2 and OFG, respectively, which are pulse signals that are both in active states (ON states) at high level and in inactive states (OFF states) at low level.

Figure 10:
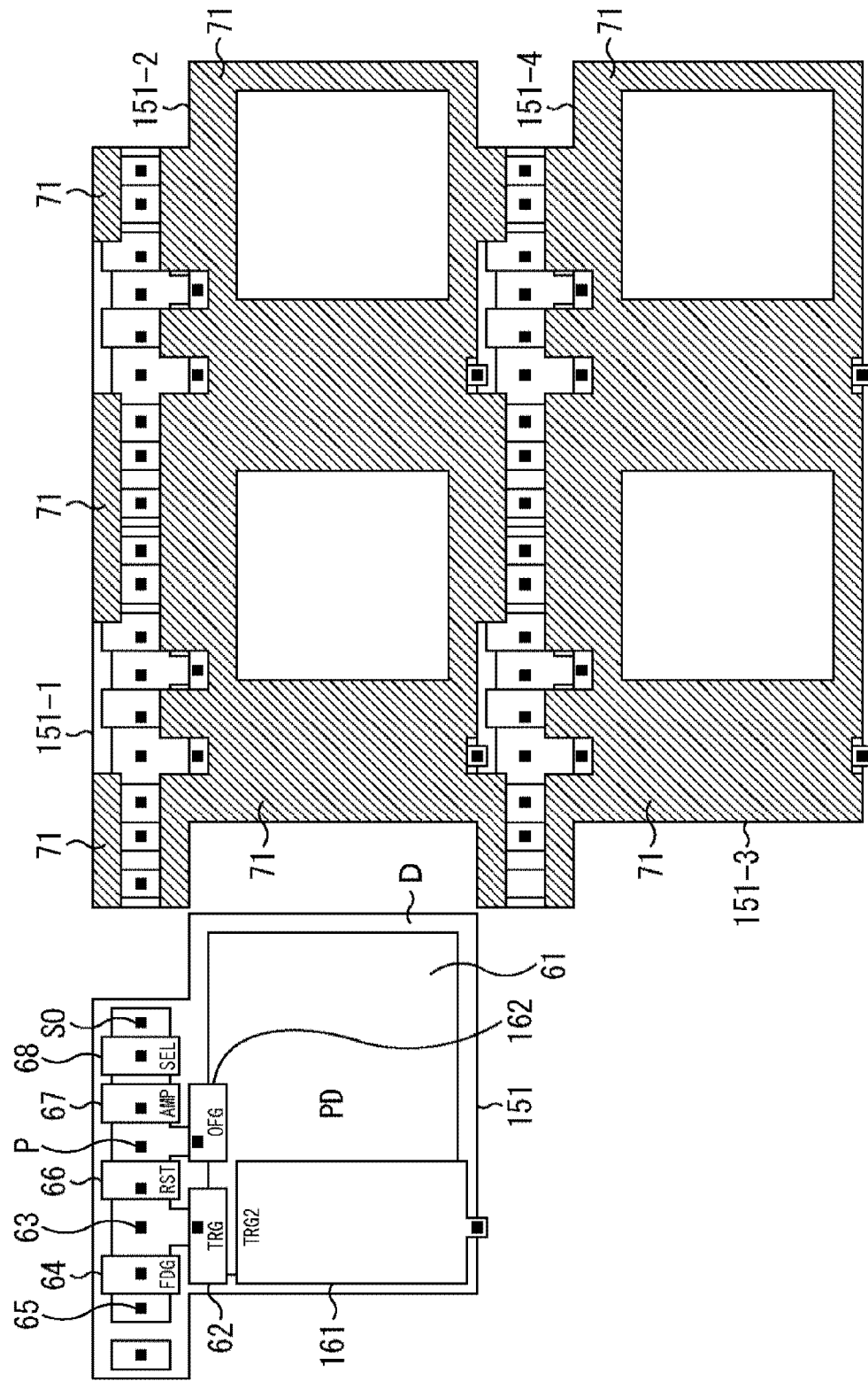
FIG. 10 is a diagram for explaining an example configuration of a metallic light blocking film formed on a substrate in FIG. 9.

In each pixel 151, as shown in pixels 151-1 to 151-4 in FIG. 10, a light blocking film 71 is formed as a second layer that is an upper layer of the first layer including the photo lode 61. In this second layer as well, the light blocking film 71 is not provided around contacts in terms of preventing short circuits. Note that the light blocking film 71 in the pixel 151 is made of tungsten, for example, and reduces light incidence on the memory 171 (FIG. 12) (PLS=parasitic light sensitivity: phenomenon similar to smear) in a global shutter CMOS image sensor.

Figure 11:
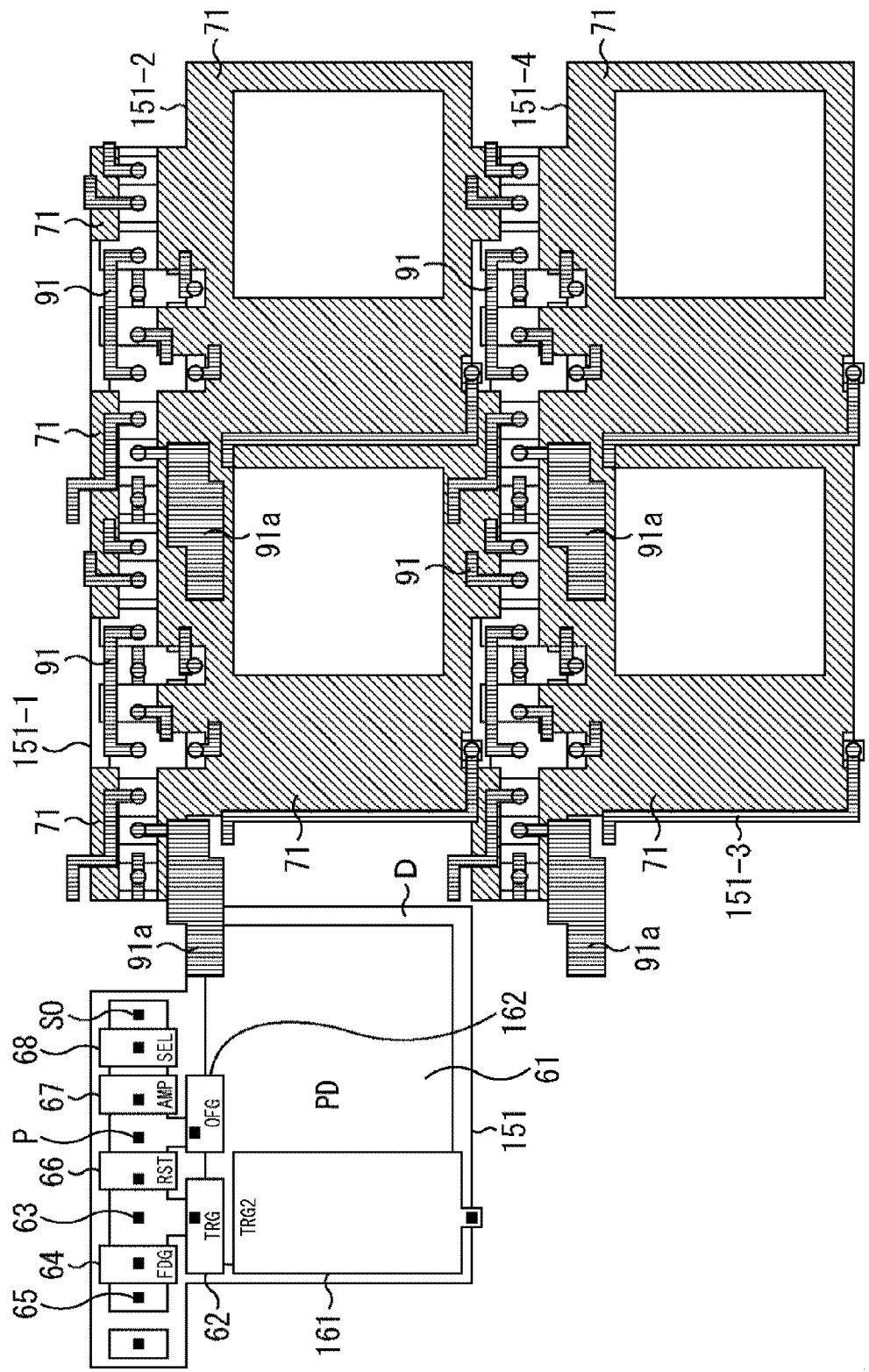
FIG. 11 is a diagram for explaining a configuration of a FD wiring layer formed on a layer constituted by the light blocking film in FIG. 10.

Furthermore, as shown in FIG. 11, a third layer constituted by FD wiring 91 is formed on the second layer constituted by, the light blocking film 71, and part of the third layer forms an electrode 91a.

Figure 12:
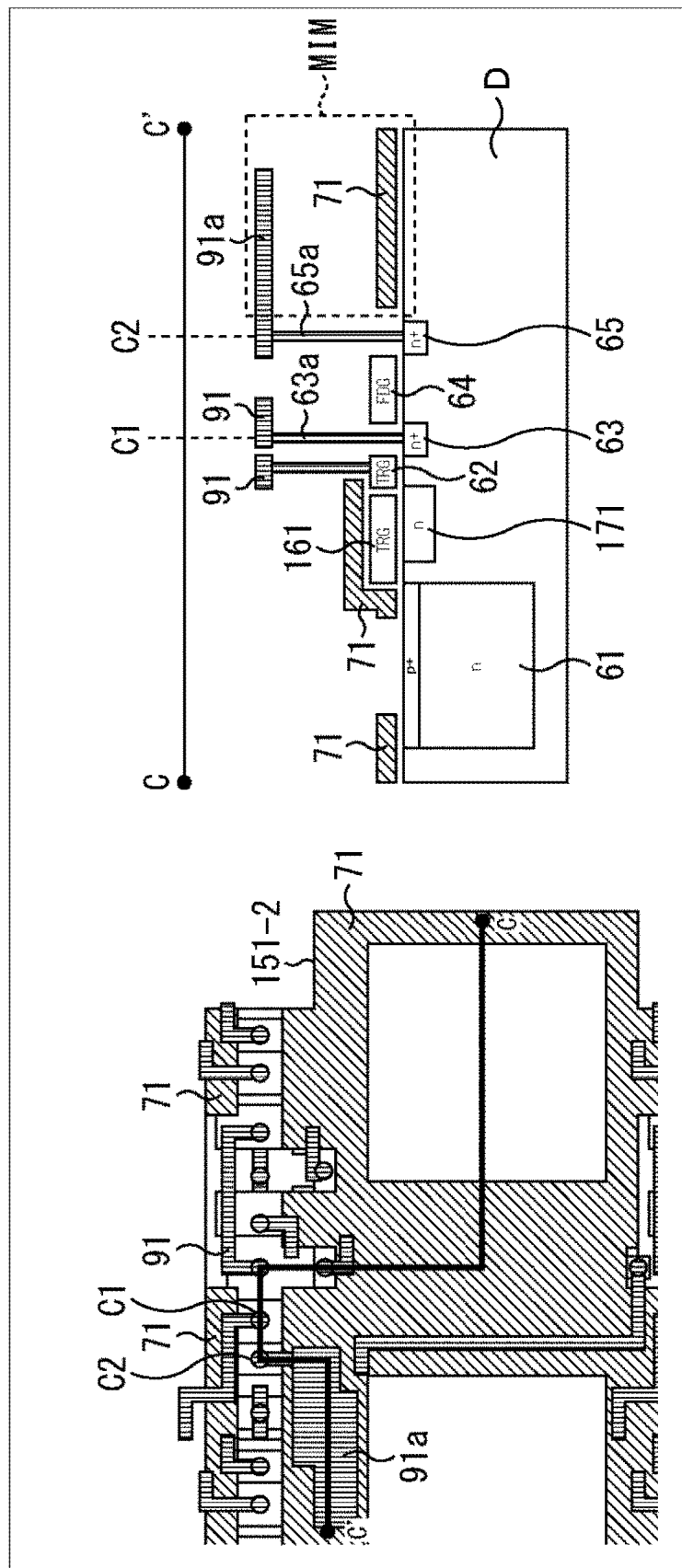
FIG. 12 is a diagram for explaining cross sections of a laminate of the layers of FIGS. 9 to 11.

In this configuration, within a range of C2-C' enclosed by a dotted line in C-C' cross section shown in FIG. 12, the electrode 91a and the light blocking film 71 are opposed to each other to form an additional capacitor MIM. In addition, the electrode 91a is connected via a contact 65a, and the capacity of the additional capacitor MIM is thus added to the charge storage 65 constituted by the floating diffusion region (n+ layer) that is the first layer.

In contrast, within a range C1-C2 shown in FIG. 12, the FD wiring 91 is connected via a contact 63a, and the charge-to-voltage converter 63 functions as the floating diffusion region (n+ layer) that is the first layer. In the charge-to-voltage converter 63, however, since the light blocking film 71 is not formed at the position opposed to the FD wiring 91 and no additional capacitor MIM is formed, the charge storage 65 has its own capacity only.

The charge-to-voltage converter 63 and the charge storage 65 formed as described above are electrically connected with and disconnected from each other by the capacity switch 64, and this enables switching of the FD conversion efficiency (sensitivity) of pixel signals.

As a result, in the global shutter CMOS image sensor as well, the switching of the FD conversion efficiency can be achieved in all the pixels.

Third Modified Example

Figure 13:
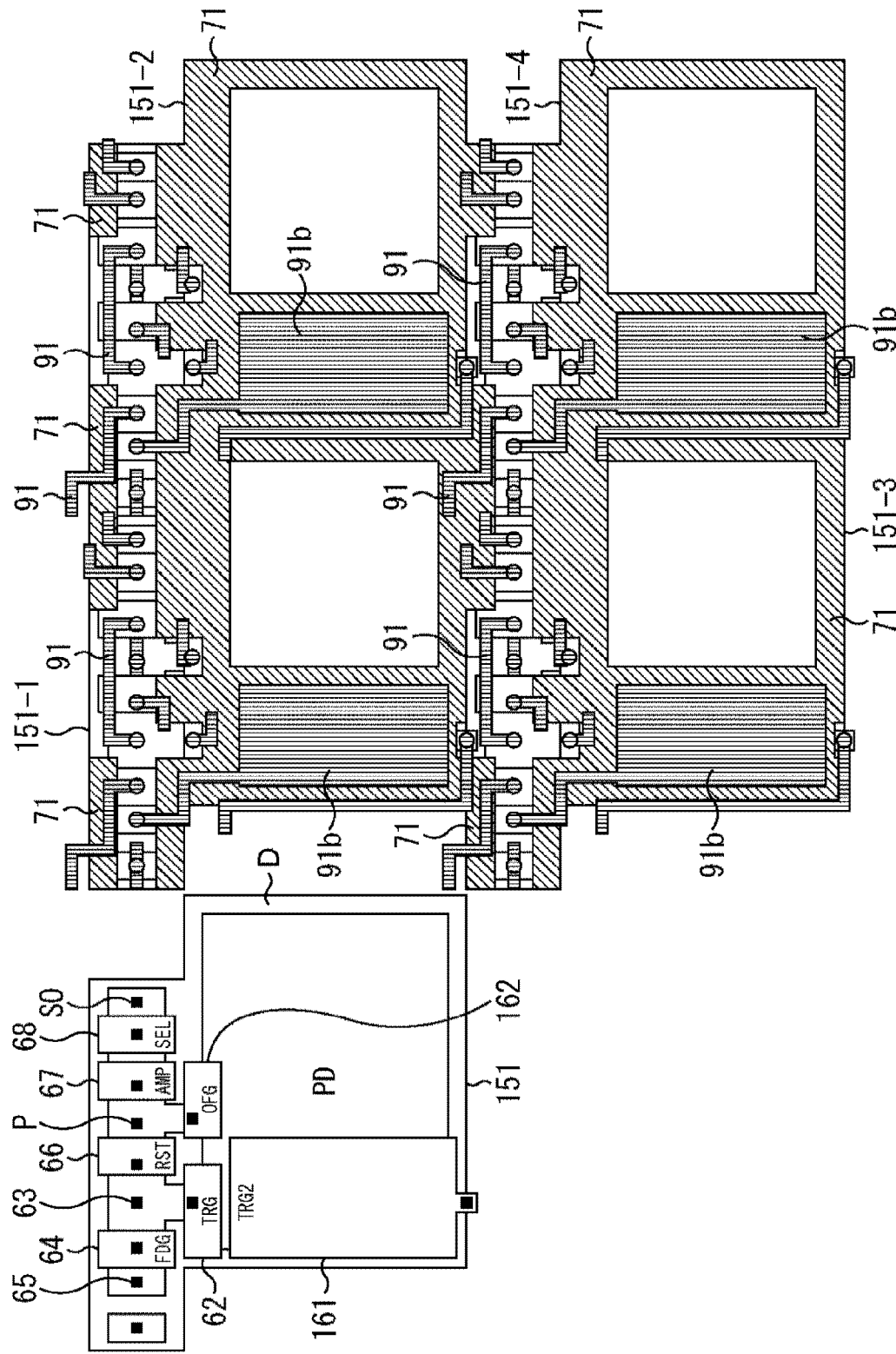
FIG. 13 is a diagram for explaining another configuration of a FD wiring layer formed on a layer constituted by the light blocking film in FIG. 10.

While an example has been described above in which the light blocking film 71 and the electrode 91a provided in the third layer are opposed to each other to form the additional capacitor MIM so that the capacity of the charge storage 65 is increased, the electrode 91a may be provided in another region as long as the electrode 91a is opposed to the light blocking film 71, and an electrode 91b may be formed instead of the electrode 91a as shown in FIG. 13, for example.

Specifically, in a pixel 151 of the global shutter CMOS image sensor, since the transfer gate 161, which is the polysilicon gate (TRG2) on the memory 171 occupying a relatively large area, is present on photodiode 61, the electrode 91b is formed as a layer thereon.

Figure 14:
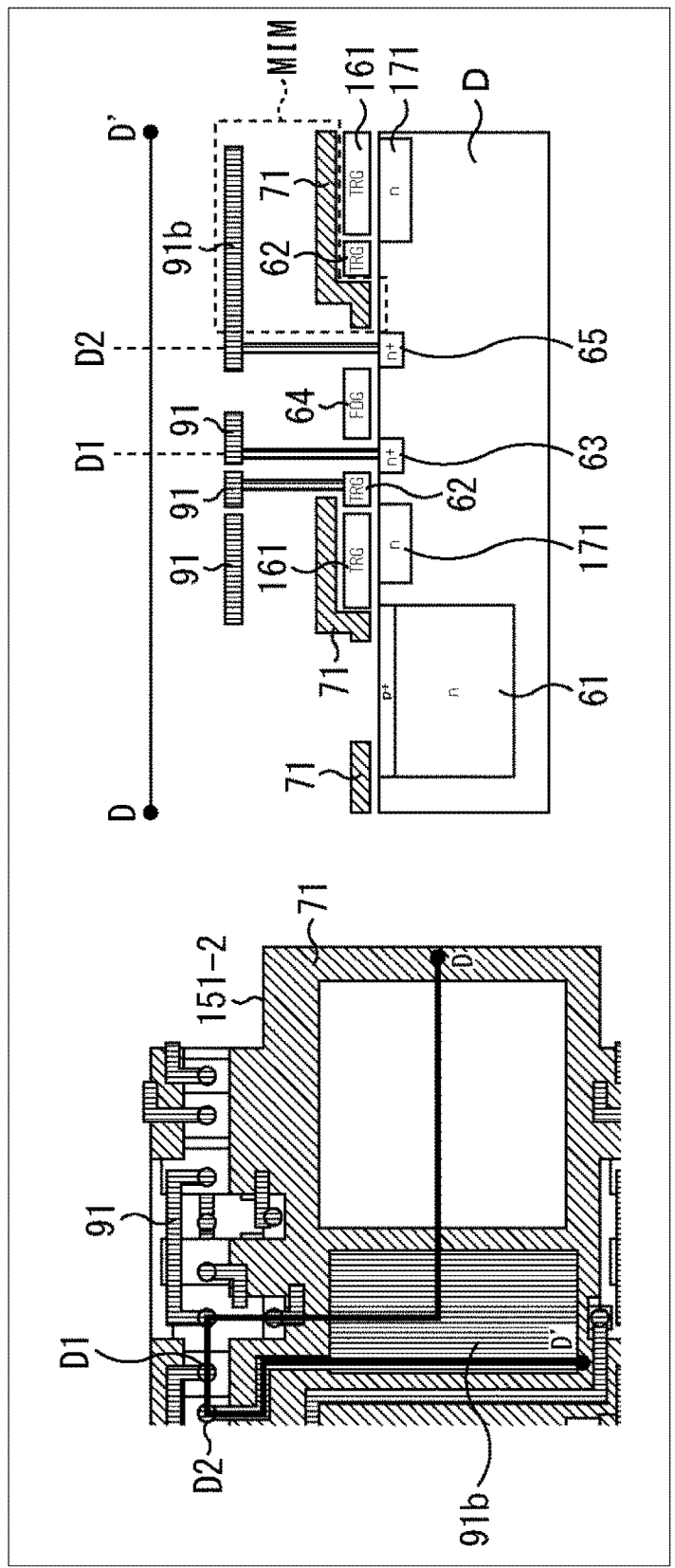
FIG. 14 is a diagram for explaining cross sections in the case of FIG. 13.

In this configuration, as shown in a range of D2-D' enclosed by a dotted line in D-D' cross section shown in FIG. 14, the electrode 91b and the light blocking film 71 are opposed to each other to form an additional capacitor MIM. In addition, the electrode 91b is connected via a contact 65a, and the capacity is thus added to the capacity of the charge storage 65 constituted by the floating diffusion region (n+ layer) that is the first layer.

In contrast, within a range D1-D2 shown in FIG. 14, the FD wiring 91 is connected via a contact 63a, and the charge-to-voltage converter 63 of the first layer functions as the floating diffusion region (n+ layer). In the charge-to-voltage converter 63, however, since the light blocking film 71 is not formed at the position opposed to the FD wiring 91, the additional capacitor MIM is not formed, and since the capacity in the case where the charge storage 65 is not connected is not added, the charge-to-voltage converter 63 has its own capacity only.

Furthermore, as shown in FIG. 14, when the electrode 91b is provided on the transfer gate 171, the distance between the electrode 91b and the light blocking film 71 is closer than that between the electrode 91a and the light blocking film 71 shown in FIG. 12, the additional capacity of the additional capacitor MIM is also increased. Consequently, the charge-to-voltage converter 63 and the charge storage 65 formed as described above are electrically connected with and disconnected from each other by the capacity switch 64, and this enables switching of the FD conversion efficiency (sensitivity) of two types of pixel signals that vary largely.

As a result, in the global shutter CMOS image sensor in which the electrode 91b is formed in this manner, the switching of the FD conversion efficiency can also be achieved in all the pixels.

<Application to Electronic Device>

The above-described solid-state image sensor is applicable to various electronic devices including imaging devices such as digital still cameras and digital video cameras, cellular phones having imaging functions, and ether devices having imaging functions, for example.

Figure 15:
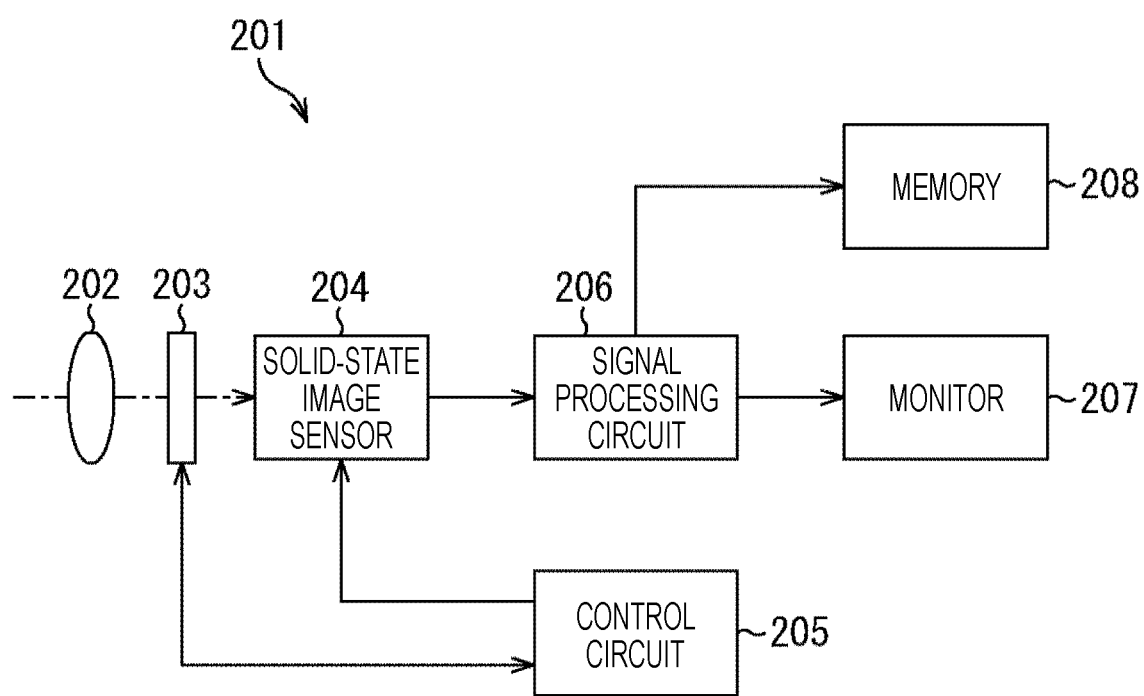
FIG. 15 is a diagram for explaining a configuration of an imaging device and an electronic device including a solid-state image sensor to which the present technology is applied.

FIG. 15 is a block diagram showing an example configuration of an imaging device that is an electronic device to which the present technology is applied.

An imaging device 201 shown in FIG. 15 includes an optical system 202, a shutter 203, a solid-state image sensor 204, a drive circuit 205, a signal processing circuit 206, a monitor 207, and a memory 203, and is capable of taking still images and video.

The optical system 202 includes one or more lenses, and is configure to guide light (incident light) from an object to the solid-state image sensor 204, and focus the light onto a light receiving surface of the solid-state image sensor 204.

The shutter 203 is disposed between the optical system 202 and the solid-state image sensor 204, and controls the light irradiation period and the light blocking period of light to the solid-state image sensor 204 under the control of the drive circuit 205.

The solid-state image sensor 204 is constituted by the above-described solid-state image sensor 11 or by a package including the solid-state image sensor 11. The solid-state image sensor 204 accumulates signal charge for a certain period according to light focused on the light receiving surface via the optical system 202 and the shutter 203. The signal charge accumulated in the solid-state image sensor 204 is transferred according to a drive signal (timing signal) supplied from the drive circuit 205.

The drive circuit 205 outputs drive signals for controlling the transfer operation of the solid-state image sensor 204 and the shutting operation of the shutter 203 to drive the solid-state image sensor 204 and the shutter 203.

The signal processing circuit 206 performs various signal processing on the signal charge output from the solid-state image sensor 204. An image (image data) obtained through the signal processing by the signal processing circuit 206 is supplied to the monitor 207 for display or supplied to the memory 208 for storage (recording).

In the imaging device 201 having such a configuration as well, the switching of the FD conversion efficiency can be achieved in all the pixels by applying the solid-state image sensor 1 instead of the aforementioned solid-state image sensor 204.

<Examples of Use of Solid-State Image Sensor>

Figure 16:
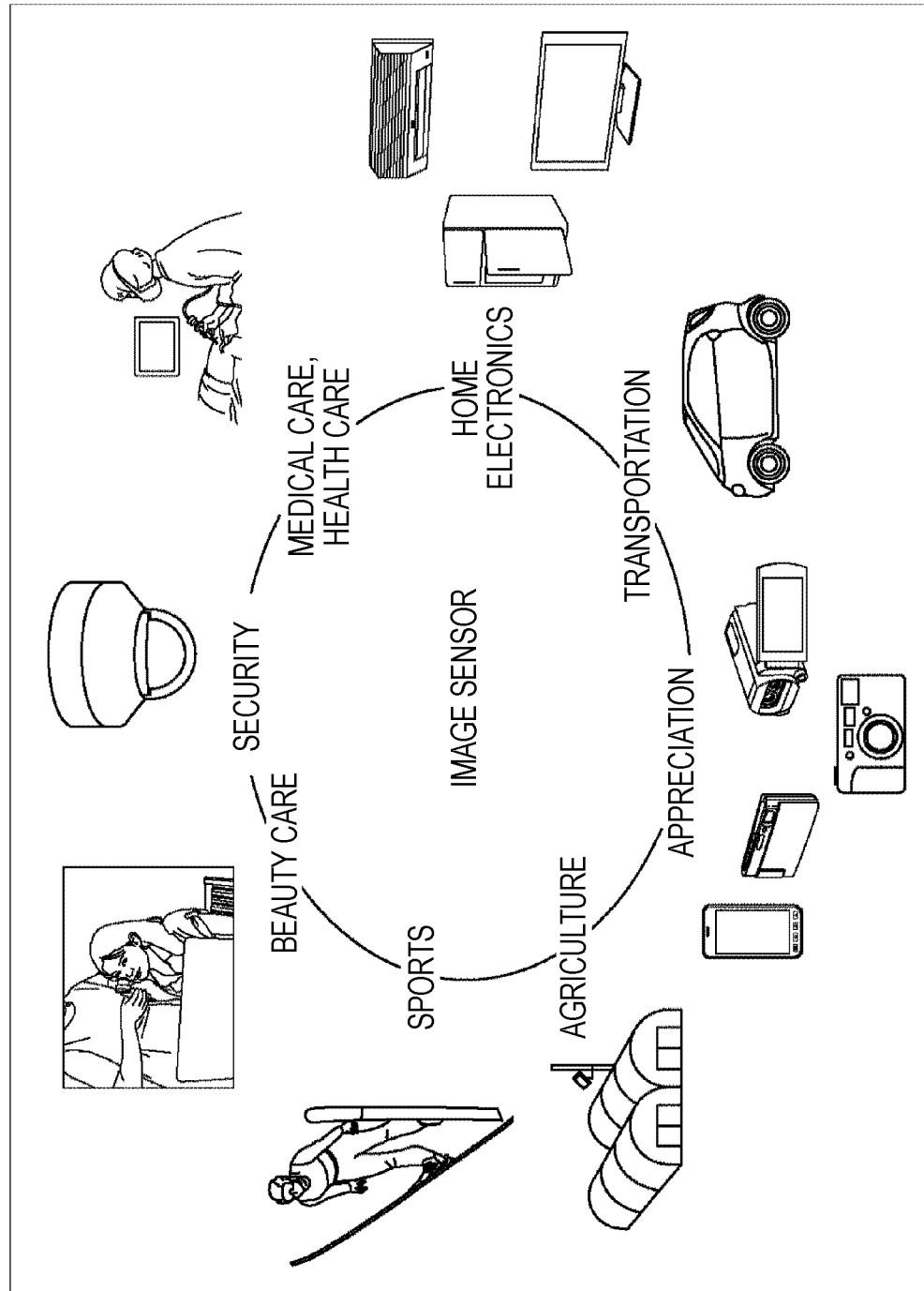
FIG. 16 is a diagram showing examples of use of the solid-state image sensor.

FIG. 16 is a diagram showing examples of use of the above-described solid-state image sensor 11.

The above-described solid-state image sensor 11 can be used in a variety of cases as follows where light such as visible light, infrared light, ultraviolet light, and X-ray is sensed as follows, for example:

- devices configured to take images for appreciation use, such as digital cameras and portable devices with camera functions,
- devices for transportation use, such as vehicle-mounted sensors for imaging the front, the back, the surrounding, the inside, or the like of an automobile for safe driving such as automatic stop, for recognition of a driver's condition, and the like, surveillance cameras for monitoring running vehicles and roads, and ranging sensors for measuring distances between vehicles, etc.,
- devices for home electronics use, such as television sets, refrigerators, and air conditioners for imaging a gesture of a user and operating a device according to the gesture,
- devices for medical care use and health care use, such as endoscopes and devices for receiving infrared light for angiography,
- devices for security use, such as surveillance cameras for crime prevention and cameras for personal authentication,
- devices for beauty care use, such as skin measurement devices configured to image a skin and microscopes for imaging a scalp,
- devices for sport use, such as action cameras and wearable cameras for sports, and
- devices for agricultural use such as cameras for monitoring conditions of fields and crops.

The present technology can also have the following configurations.

(1) A front-surface illuminated solid-state image sensor including: a photoelectric converter configured to perform photoelectric conversion of incident light; a charge-to-voltage converter configured to store charge obtained by the photoelectric conversion; a charge storage configured to add a capacity to the charge-to-voltage converter; and an additional capacitor configured to add a capacity to the charge storage, wherein the additional capacitor is constituted by a first electrode formed by a wiring layer in which wiring electrically connected to terminals of the voltage converter and the charge storage, and a second electrode formed by a metallic layer provided on a surface of a substrate on which the photoelectric converter is formed, the surface of the substrate being on a side closer to a light source of the light, the metallic layer being provided closer to the substrate than the wiring layer is and being opposed to the wiring layer.

(2) The solid-state image sensor of (1), wherein the charge storage and the additional capacitor are provided for each pixel having the photoelectric converter, and when charge is stored in the charge-to-voltage converter in a given pixel, the charge storage provided in the given pixel adds a charge capacity including an additional capacity stored by the additional capacitor to the charge-to-voltage converter.

(3) The solid-state image sensor of (2), further including a switching unit configured to switch to either of a state in which the charge-to-voltage converter and the charge storage are electrically connected with each other and a state in which the charge-to-voltage converter and the charge storage are electrically disconnected from each other.

(4) The solid-state image sensor of (1), wherein the metallic layer is a light blocking film made of metal.

(5) The solid-state image sensor of (4), wherein the metallic layer is a light blocking film made of tungsten.

(6) The solid-state image sensor of (4), wherein the light blocking film is formed for forming a pixel for imaging plane phase difference detection.

(7) The solid-state image sensor of (4), wherein when a polysilicon layer is provided on the surface of the substrate on the side of the light source of the light, the light blocking film is formed on the polysilicon on the substrate.

(8) The solid-state image sensor of (7), wherein the light blocking film is formed on a transfer gate constituted by the polysilicon layer provided on the surface of the substrate on the side of the light source of the light.

(9) The solid-state image sensor of (4), wherein the light blocking film shields any of an upper portion, a lower portion, a left portion and a right portion of the photoelectric converter.

(10) The solid-state image sensor of (4), wherein the wiring layer is closer to the second electrode than a wiring layer of typical wiring is.

(11) The solid-state image sensor of (4), wherein the solid-state image sensor is of a global shutter type, the solid-state image sensor further including a storage unit configured to store pixel signals of respective pixels required for the global shutter type, wherein the light blocking film shields the storage unit.

(12) The solid-state image sensor of (11), wherein the first electrode is provided at a position opposed to the light blocking film on the storage unit.

(13) An imaging device including a front-surface illuminated solid-state image sensor, the imaging device including: a photoelectric converter configured to perform photoelectric conversion of incident light; a charge-to-voltage converter configured to store charge obtained by the photoelectric conversion; a charge storage configured to add a capacity to the charge-to-voltage converter; and an additional capacitor configured to add a capacity to the charge storage, wherein the additional capacitor is constituted by a first electrode formed by a wiring layer in which wiring electrically connected to terminals of the voltage converter and the charge storage is formed, and a second electrode formed by a metallic layer provided on a surface of a substrate on which the photoelectric converter is formed, the surface of the substrate being on a side closer to a light source of the light, the metallic layer being provided closer to the substrate than the wiring layer is and being opposed to the wiring layer.

(14) An electronic device including a front-surface illuminated solid-state image sensor, the electronic device including: a photoelectric converter configured to perform photoelectric conversion of incident light; a charge-to-voltage converter configured to store charge obtained by the photoelectric conversion; a charge storage configured to add a capacity to the charge-to-voltage converter; and an additional capacitor configured to add a capacity to the charge storage, wherein the additional capacitor is constituted by a first electrode formed by a wiring layer in which wiring electrically connected to terminals of the voltage converter and the charge storage is formed, and a second electrode formed by a metallic layer provided on a surface of a substrate on which the photoelectric converter is formed, the surface of the substrate being on a side closer to a light source of the light, the metallic layer being provided closer to the substrate than the wiring layer is and being opposed to the wiring layer.

REFERENCE SIGNS LIST

11 Solid-state image sensor
21 Pixel array unit
51 Pixel
61 Photodiode
62 Transfer gate
63 Charge-to-voltage converter
64 Capacity switch
65 Charge storage
66 Reset gate
67 Amplification transistor
68 Selection transistor
71 Light blocking film
91 FD wiring
91a Electrode
151 Pixel
161 Transfer gate
162 Overflow gate

What is claimed is:

1. An image sensor comprising:
a plurality of pixels, wherein each pixel includes:
a photoelectric converter configured to perform photoelectric conversion of incident light, wherein the photoelectric converter is formed in a substrate;
a charge-to-voltage converter configured to store charge obtained by the photoelectric converter;
a charge storage configured to store charge transferred from the charge-to-voltage converter; and
a switch electrically connected to the charge-to-voltage converter and the charge storage;
a wiring layer; and
a metallic layer disposed between the substrate and the wiring layer, wherein the metallic layer includes an aperture in an area corresponding to at least a portion of an area of the photoelectric converter, wherein for each of the pixels an electrode provided as part of the wiring layer is opposite a portion of the metallic layer to form at least a portion of the charge storage.

2. The image sensor according to claim 1, wherein, when charge is stored in the charge-to-voltage converter in a given pixel, the charge storage provided in the given pixel adds a charge capacity to the charge-to-voltage converter, the added charge capacity including an additional capacity stored by the at least one of the wiring layer or the metallic layer.

3. The image sensor according to claim 2, wherein the switch is configured to switch to either of a state in which the charge-to-voltage converter and the charge storage are electrically connected with each other and a state in which the charge-to-voltage converter and the charge storage are electrically disconnected from each other.

4. The image sensor according to claim 1, wherein metallic layer is a light blocking film made of metal.

5. The image sensor according to claim 4, wherein the metal includes tungsten.

6. The image sensor according to claim 4, wherein at least a first aperture in the light blocking film is associated with a first pixel that is formed for phase difference detection.

7. The image sensor according to claim 4, wherein a polysilicon layer is provided on a surface of the substrate that is a light incident side, and wherein the light blocking film is formed on the polysilicon layer.

8. The image sensor according to claim 7, wherein the light blocking film is formed on a transfer gate that includes the polysilicon layer provided on the surface of the substrate.

9. The image sensor according to claim 6, wherein the light blocking film shields one or more of an upper portion, a lower portion, a left portion, and a right portion of the photoelectric converter of the first pixel.

10. The image sensor according to claim 4, wherein, in a cross-sectional view, the light blocking film is closer to a control gate of the switch than the wiring.

11. The image sensor according to claim 4, wherein the image sensor comprises a global shutter type image sensor.

12. The image sensor according to claim 11, wherein the wiring layer is provided at a position opposed to the light blocking film on a storage unit of the global shutter type image sensor.

13. The image sensor according to claim 1, wherein the image sensor includes a plurality of groups of pixels arranged in groups of four pixels.

14. The image sensor of claim 13, wherein at least some of the groups of pixels include a phase difference detection pixel.

15. An electronic device comprising:
a plurality of pixels, wherein each pixel includes:
a photoelectric converter configured to perform photoelectric conversion of incident light, wherein the photoelectric converter is formed in a substrate;
a charge-to-voltage converter configured to store charge obtained by the photoelectric converter;
a charge storage configured to store charge transferred from the charge-to-voltage converter; and
a switch electrically connected to the charge-to-voltage converter and the charge storage;
a wiring layer; and
a metallic layer disposed between the substrate and the wiring layer, wherein the metallic layer includes an aperture in an area corresponding to at least a portion of an area of the photoelectric converter, wherein for each of the pixels an electrode provided as part of the wiring layer is opposite a portion of the metallic layer to form at least a portion of the charge storage.

* * * * *